US010615012B2

United States Patent
Ishihara et al.

(10) Patent No.: US 10,615,012 B2
(45) Date of Patent: *Apr. 7, 2020

(54) SPUTTERING APPARATUS AND SUBSTRATE PROCESSING APPARATUS

(71) Applicant: CANON ANELVA CORPORATION, Kawasaki-shi, Kanagawa-ken (JP)

(72) Inventors: Shigenori Ishihara, Tokyo (JP); Hiroyuki Toya, Hachioji (JP); Yasushi Yasumatsu, Inagi (JP); Toshikazu Nakazawa, Saitama (JP); Eiji Nakamura, Machida (JP); Shintaro Suda, Kawasaki (JP); Shin Imai, Kawasaki (JP); Yuu Fujimoto, Hino (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 74 days.

This patent is subject to a terminal disclaimer.

(21) Appl. No.: 15/976,921

(22) Filed: May 11, 2018

(65) Prior Publication Data

US 2018/0261440 A1    Sep. 13, 2018

Related U.S. Application Data

(63) Continuation of application No. 14/724,221, filed on May 28, 2015, now Pat. No. 9,997,339, which is a (Continued)

(30) Foreign Application Priority Data

Nov. 30, 2012    (JP) .................................. 2012-263649

(51) Int. Cl.
C23C 14/34    (2006.01)
H01J 37/34    (2006.01)
C23C 14/35    (2006.01)

(52) U.S. Cl.
CPC ........ *H01J 37/3447* (2013.01); *C23C 14/352* (2013.01); *H01J 37/3405* (2013.01); *H01J 37/3429* (2013.01)

(58) Field of Classification Search
CPC .......................... H01J 37/3429; H01J 37/3447
See application file for complete search history.

(56) References Cited

U.S. PATENT DOCUMENTS 8,900,426 B2    12/2014    Nomura et al.
9,039,873 B2    5/2015    Tsunekawa
(Continued)

FOREIGN PATENT DOCUMENTS

JP    62-074072 A    4/1987
JP    11-229139 A    8/1999
(Continued)

OTHER PUBLICATIONS

International Search Report (PCT/ISA/210) dated Oct. 22, 2013, by the Japanese Patent Office as the International Searching Authority for International Application No. PCT/JP2013/004974.
(Continued)

Primary Examiner — Jason Berman
(74) Attorney, Agent, or Firm — Buchanan, Ingersoll & Rooney PC

(57) ABSTRACT

A sputtering apparatus includes a shutter unit, a plurality of target holders, and a substrate holder which can rotate about an axis perpendicular to a surface on which a substrate is held. The shutter unit includes a first shutter having first and second apertures and a second shutter having third and fourth apertures. The plurality of target holders are arranged on a first virtual circle centered on the axis, with the arrangement intervals between the plurality of target holders on the first virtual circle including at least two types of arrangement intervals.

5 Claims, 22 Drawing Sheets

Related U.S. Application Data continuation of application No. PCT/JP2013/004974, filed on Aug. 23, 2013.

(56) References Cited

U.S. PATENT DOCUMENTS

| 9,997,339 B2* | 6/2018 | Ishihara | H01J 37/3405 |
| 10,062,551 B2* | 8/2018 | Ishihara | H01J 37/3405 |
| 2002/0064595 A1 | 5/2002 | Nomura et al. | |
| 2005/0199490 A1 | 9/2005 | Nomura et al. | |
| 2009/0139865 A1 | 6/2009 | Nomura et al. | |
| 2010/0200394 A1 | 8/2010 | Nagamine et al. | |
| 2012/0164354 A1 | 6/2012 | Otani et al. | |
| 2013/0277207 A1 | 10/2013 | Tsunekawa | |
| 2015/0001068 A1 | 1/2015 | Tsunekawa | |

FOREIGN PATENT DOCUMENTS

| JP | 2002-167661 A | 6/2002 |
| JP | 2009-041108 A | 2/2009 |
| JP | 2011-001597 | 1/2011 |
| JP | 2012-149339 A | 8/2012 |
| KR | 10-2006-0044320 | 5/2006 |
| WO | WO 2009/044474 A1 | 4/2009 |
| WO | WO 2012/090395 | 7/2012 |
| WO | WO 2012/090395 A1 | 7/2012 |
| WO | WO 2014/083728 A1 | 6/2014 |

OTHER PUBLICATIONS

Written Opinion (PCT/ISA/237) dated Oct. 22, 2013, by the Japanese Patent Office as the International Searching Authority for International Application No. PCT/JP2013/004974.

Office Action (Notification of the First Office Action) dated Apr. 20, 2016, by the State Intellectual Property Office of the People's Republic of China, in corresponding Chinese Patent Application No. 201380062382.4 and an English Translation of the Office Action. (12 pages).

Office Action (Notice of Preliminary Rejection) dated Jul. 1, 2016, by the Korean Intellectual Property Office in corresponding Korean Patent Application 10-2015-7016989, and an English Translation of the Office Action. (9 pages).

* cited by examiner

SPUTTERING APPARATUS AND SUBSTRATE PROCESSING APPARATUS

The present application is a continuation of U.S. application Ser. No. 14/724,221, filed on May 28, 2015, which is a continuation of International Patent Application No. PCT/JP2013/004974 filed on Aug. 23, 2013, and claims priority to Japanese Patent Application No. 2012-263649 filed on Nov. 30, 2012, the entire contents of U.S. Ser. No. 14/724,221; PCT/JP2013/004979 and JP 2012-263649 are incorporated herein by reference.

TECHNICAL FIELD

The present invention relates to a sputtering apparatus and a substrate processing apparatus.

BACKGROUND ART

PTL 1 discloses an arrangement in which a plurality of sputtering apparatuses are arranged around a conveyance chamber. In each sputtering apparatus, four targets are arranged on the ceiling portion of a vessel forming a deposition chamber. A double rotary shutter mechanism is arranged between these targets and a substrate holder.

CITATION LIST

Patent Literature

PTL 1: Japanese Patent Laid-Open No. 2009-41108

SUMMARY

Technical Problem

FIGS. 20 and 21 schematically show a sputtering apparatus including a plurality of targets arranged at equal intervals and a double rotary shutter mechanism which selects a target to be used for sputtering from the plurality of targets. Note that FIGS. 20 and 21 were created by the present inventor but do not constitute the related art.

FIG. 20 schematically shows how sputtering (co-sputtering) is performed by simultaneously using two targets T1 and T3 of targets T1, T2, and T3 arranged at equal intervals. The double rotary shutter mechanism includes a first shutter S1 and a second shutter S2. The first shutter S1 has two apertures OP11 and OP12. The second shutter S2 has two apertures OP21 and OP22.

The rotational angle of the first shutter S1 is controlled to make the two apertures OP11 and OP12 face the targets T1 and T3, respectively. The rotational angle of the second shutter S2 is controlled to make the two apertures OP21 and OP22 face the targets T1 and T3, respectively. The materials emitted from the targets T1 and T3 reach a substrate SUB through the apertures OP11 and OP12 of the first shutter S1 and the apertures OP21 and OP22 of the second shutter S2, thereby forming a film on the substrate SUB.

FIG. 21 schematically shows how sputtering is performed by using one target T1 of the targets T1, T2, and T3 arranged at equal intervals. The rotational angle of the first shutter S1 is controlled to make two apertures OP11 and OP12 face the targets T1 and T3, respectively. The rotational angle of the second shutter S2 is controlled to make two apertures OP21 and OP22 face the targets T2 and T1, respectively. The material emitted from the target T1 reaches the substrate SUB through the aperture OP11 of the first shutter S1 and the aperture OP22 of the second shutter S2, thereby forming a film on the substrate SUB. In this case, as schematically indicated by an arrow 21, the material emitted from the target T1 moves between the first shutter S1 and the second shutter S2 upon passing through the aperture OP11 of the first shutter S1, reaches the target T3 through the aperture OP12 of the second shutter S2, and can adhere to the surface of the target T3. This can contaminate the target T3.

As described above, when a plurality of apertures are provided for the first shutter to perform co-sputtering in an arrangement in which a plurality of targets are arranged at equal intervals, other targets may be contaminated when sputtering is performed by using one target.

The present invention has been made upon recognition of the above problem, and has as its object to provide a technique advantageous in reducing contamination on a target.

Solution to Problem

According to the first aspect of the present invention, there is provided a sputtering apparatus which includes a chamber, a substrate holder configured to hold a substrate in the chamber and rotate about an axis perpendicular to a surface on which the substrate is held, and a plurality of target holders configured to respectively hold targets, comprising a shutter unit configured to select a target to be used for sputtering from a plurality of targets respectively held by the plurality of target holders, wherein the shutter unit includes a first shutter and a second shutter configured to rotate about the axis and spaced apart from each other in a direction along the axis, the plurality of target holders are arranged on a first virtual circle centered on the axis, with arrangement intervals between the plurality of target holders on the first virtual circle including at least two types of arrangement intervals, the first shutter has a first aperture and a second aperture, with centers of the first aperture and the second aperture being arranged on a second virtual circle centered on the axis, and the second shutter has a third aperture and a fourth aperture, with centers of the third aperture and the fourth aperture being arranged on a third virtual circle centered on the axis, and a central angle of an arc, on the second virtual circle, whose two ends respectively correspond to the centers of the first aperture and the second aperture is equal to a central angle of an arc, on the third virtual circle, whose two ends respectively correspond to the centers of the third aperture and the fourth aperture, and is equal to a central angle of an arc whose two ends respectively correspond to the centers of the first target and the second target, of the plurality of target holders, an interval between which is the largest on the first virtual circle.

According to the second aspect of the present invention, there is provided a substrate processing apparatus comprising a conveyance chamber having a plurality of connection surfaces, and a sputtering apparatus connected to at least one of the plurality of connection surfaces, wherein the sputtering apparatus comprises a sputtering apparatus according to the first aspect, and an angle defined by adjacent connection surfaces of the plurality of connection surfaces is larger than 90°.

Advantageous Effects of Invention

The present invention provides a technique advantageous in reducing contamination on a target.

DESCRIPTION OF EMBODIMENTS

The present invention will be described through an exemplary embodiment with reference to the accompanying drawings.

Figure 1A:
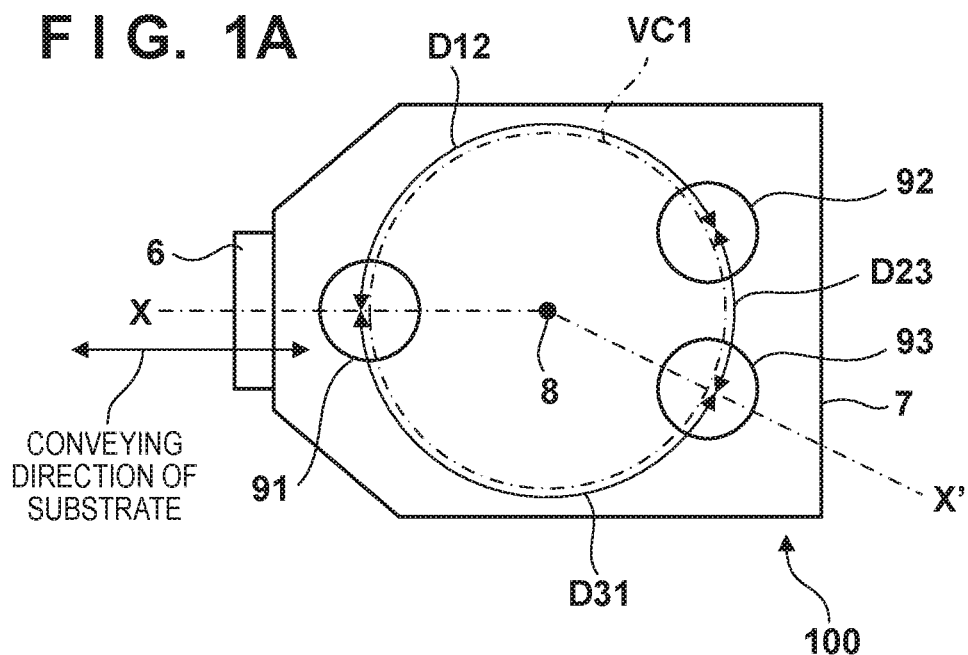
FIG. 1A is a schematic plan view of a sputtering apparatus according to the first embodiment of the present invention.
Figure 1B:
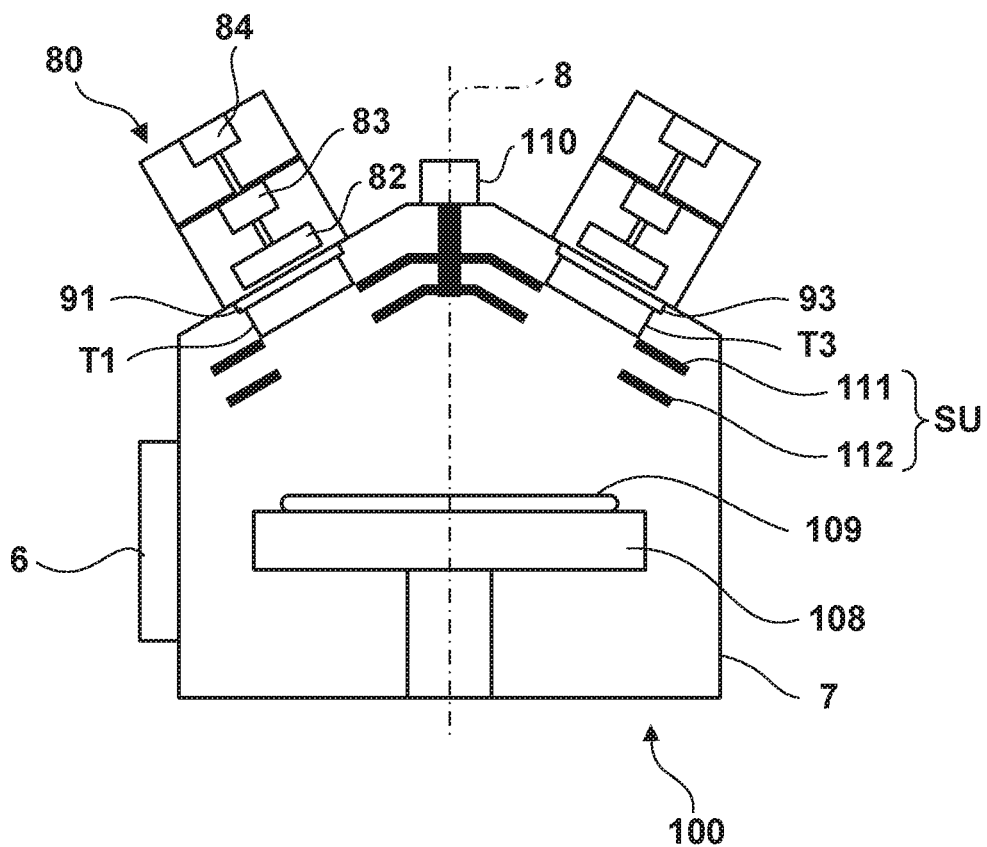
FIG. 1B is a schematic sectional view of the sputtering apparatus according to the first embodiment of the present invention.

FIG. 1A is a schematic plan view of a sputtering apparatus 100 according to the first embodiment of the present invention. FIG. 1B is a schematic sectional view of a sputtering apparatus 100 taken along a line X-X' in FIG. 1A. The sputtering apparatus 100 includes a chamber 7, a substrate holder 108, and first to third target holders 91, 92, and 93 as a plurality of target holders.

The substrate holder 108 can hold a substrate 109 in the chamber 7 and rotate about an axis 8 perpendicular to the surface of the substrate 109. The first to third target holders 91, 92, and 93 respectively hold targets T1, T2, and T3. The first to third target holders 91, 92, and 93 as a plurality of target holders are arranged along a first virtual circle VC1 centered on the axis 8 clockwise in the order of the first target holder 91, the second target holder 92, and the third target holder 93.

There are at least two types of arrangement intervals between the first to third target holders 91, 92, and 93 on the first virtual circle VC1. In this case, the arrangement interval between the first target holder 91 and the second target holder 92 on the first virtual circle VC1 is represented by D12, the arrangement interval between the second target holder 92 and the third target holder 93 on the first virtual circle VC1 is represented by D23, and the arrangement interval between the third target holder 93 and the first target holder 91 on the first virtual circle VC1 is represented by D31. In the case shown in FIG. 1A, D12=D31>D23, and there are two types of arrangement intervals between the first to third target holders 91, 92, and 93 on the first virtual circle VC1. If all the intervals D12, D23, and D31 are different from each other, there are three types of arrangement intervals between the first to third target holders 91, 92, and 93 on the first virtual circle VC1.

The sputtering apparatus 100 is provided with a gate valve 6, and the substrate 109 is conveyed between the internal space and the external space of a chamber 7 through the gate valve 6.

The sputtering apparatus 100 also includes a shutter unit SU for selecting a target to be used for sputtering from the targets T1, T2, and T3 respectively held by the first to third target holders 91, 92, and 93. The shutter unit SU can include first and second shutters 111 and 112 which can rotate about the axis 8 and a driving unit 110 which individually rotates the first and second shutters 111 and 112. The first shutter 111 and the second shutter 112 each have two apertures, and can perform sputtering by simultaneously using two targets (co-sputtering).

Figure 2A:
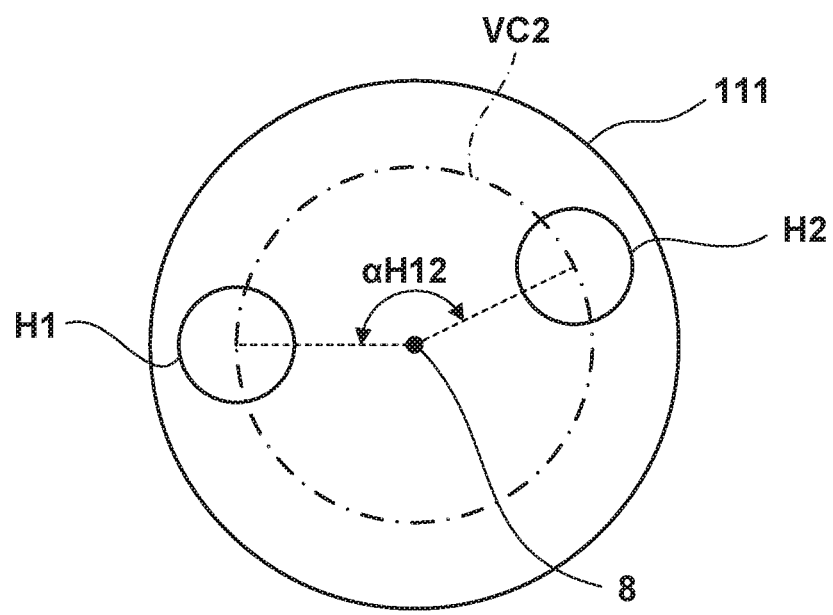
FIG. 2A is a view showing an example of the arrangement of a first shutter.
Figure 2B:
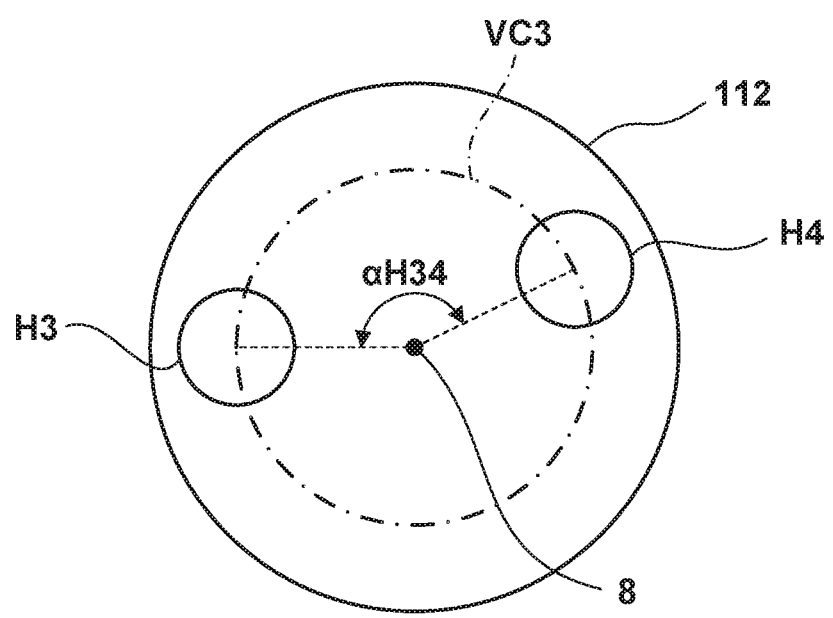
FIG. 2B is a view showing an example of the arrangement of a second shutter.

As exemplarily shown in FIG. 2A, the first shutter 111 has first and second apertures H1 and H2 whose centers are arranged on a second virtual circle VC2 centered on the axis 8. As exemplarily shown in FIG. 2B, the second shutter 112 has third and fourth apertures H3 and H4 whose centers are arranged on a third virtual circle VC3 centered on the axis 8. The driving unit 110 drives the first shutter 111 and the second shutter 112 such that one of the targets T1, T2, and T3 which is used for sputtering is exposed to the substrate 109 through the aperture of the first shutter 111 and the aperture of the second shutter 112. The first shutter 111 and the second shutter 112 are arranged so as to be spaced apart from each other in a direction along the axis 8. The first shutter 111 is arranged between the target holders 91, 92, and 93 and the second shutter 112.

A central angle $\alpha H12$ of an arc, on the second virtual circle VC2, whose two ends respectively correspond to the centers of the first and second apertures H1 and H2 of the first shutter 111 is equal to a central angle $\alpha H34$ of an arc, on the third virtual circle VC3, whose two ends respectively correspond to the centers of the third and fourth apertures H3 and H4 of the second shutter 112, and is equal to the central angle of an arc whose two ends respectively correspond to the centers of the first and second target holders 91 and 92, of the plurality of target holders 91, 92, and 93, the interval between which is the largest on the first virtual circle VC1. Note that if D12=D31>D23, the third target holder 93 and the first target holder 91, besides the first target holder 91 and the second target holder 92, are two targets, of the plurality of target holders 91, 92, and 93, the interval between which is the largest on the first virtual circle VC1.

A magnet unit 80 is arranged on the reverse surface side of each of the targets 91, 92, and 93. Each magnet unit 80 can include a magnet 82 for causing magnetron discharge (for example, DC magnetron discharge) and a driving unit 83 for driving (for example, rotating) the magnet 82. Each magnet unit 80 can also include a distance adjusting unit 84 for adjusting the distance between the magnet 82 and the target holder (target).

Each of the target holders 91, 92, and 93 can be configured to hold a corresponding one of the targets T1, T2, and T3 in a posture in which its surface is inclined with respect to the surface of the substrate 109 held by the substrate holder 108. In this case, each of the target holders 91, 92, and 93 can hold a corresponding one of the targets T1, T2, and T3 such that a normal line to its surface is directed to the center of the substrate 109. In this case, each magnet unit 80 can be arranged such that its upper portion is inclined so as to separate from the axis 8.

As exemplarily shown in FIG. 19, in order to arrange many sputtering apparatuses 100 around a conveyance chamber 400, it should decrease the size of the sputtering apparatus 100 in a direction (to be referred to as a "widthwise direction" hereinafter) perpendicular to the conveying direction of the substrate 109 between the conveyance chamber 400 and the sputtering apparatus 100. As described above, when the magnet unit 80 is inclined such that the upper portion of the magnet unit 80 is separated from the axis 8, the occupied area of the sputtering apparatus 100 can be decided by the upper portion of the magnet unit 80. In consideration of this, in the arrangement including the first to third target holders 91, 92, and 93, the first to third target holders 91, 92, and 93 are preferably arranged such that the first target holder 91 is located nearest to the gate valve 6.

Control on the positional relationship between the targets T1, T2, and T3, the apertures H1 and H2 of the first shutter 111, and the apertures H3 and H4 of the second shutter 112 will be exemplarily described below with reference to FIGS. 3A to 6C. The sputtering apparatuses according to this embodiment are arranged such that the respective targets are arranged while being inclined toward a substrate. For the sake of descriptive convenience, however, FIGS. 3A to 6C show that the targets T1, T2, and T3, the apertures H1 and H2 of the first shutter 111, and the apertures H3 and H4 of the second shutter 112 are parallel to each other. FIGS. 6A to 6C are sectional views of the targets T1, T2, and T3, the apertures H1 and H2 of the first shutter 111, and the apertures H3 and H4 of the second shutter 112 along the first virtual circle VC1. The controller shown in FIG. 22 can control the positional relationship exemplarily shown in FIGS. 3A to 6C.

Referring to FIGS. 3A to 6C, each target indicated by the hatching is the one that is used for sputtering, and each target indicated by the outline solid line or outline dotted line is the one that is not used for sputtering. In addition, each target indicated by the outline solid line is the one that is located at the same position as that of an aperture of the first shutter 111 or an aperture of the second shutter 112. Each target indicated by the outline dotted line is the one that is located at a position different from either that of each aperture of the first shutter 111 or that of each aperture of the second shutter 112.

Figure 3A:
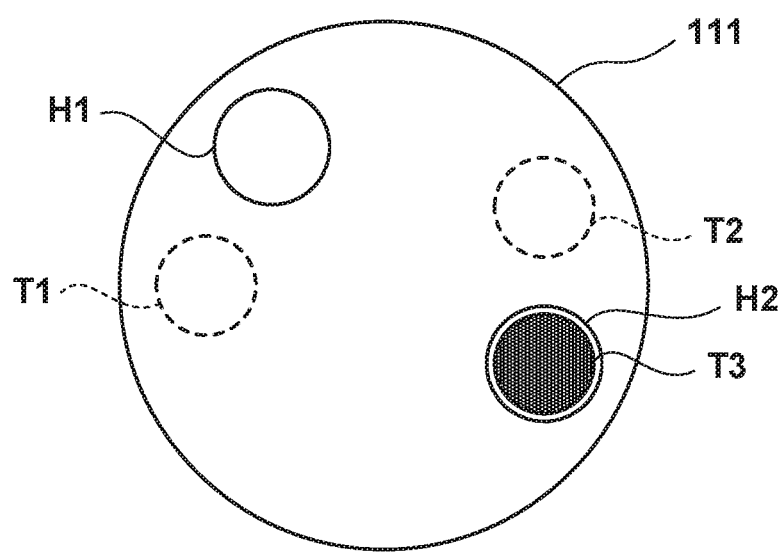
FIG. 3A is a view exemplarily showing control on the positional relationship between targets and the apertures of the first and second shutters.
Figure 3B:
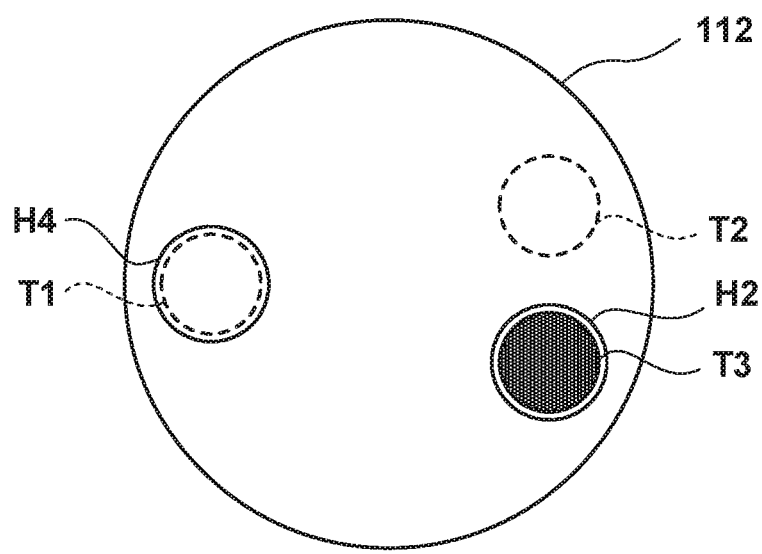
FIG. 3B is a view exemplarily showing control on the positional relationship between the targets and the apertures of the first and second shutters.
Figure 21:
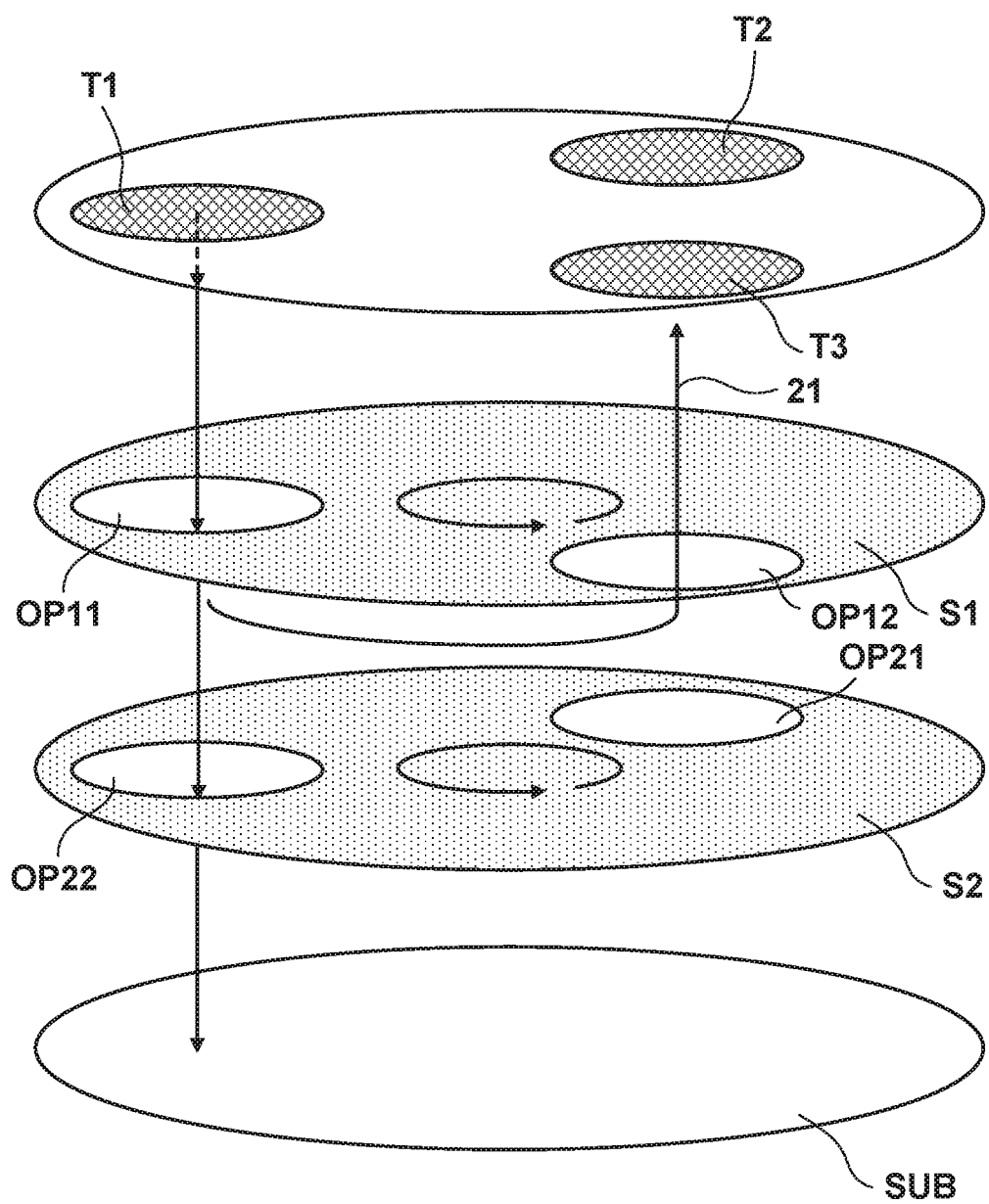
FIG. 21 is a view exemplarily showing the sputtering apparatus including the plurality of targets arranged at equal intervals and the double rotary shutter which selects a target to be used for sputtering from the plurality of targets.

FIGS. 3A, 3B, and 6A each exemplarily show a state in which one target T3 of the targets T1, T2, and T3 is used for sputtering. In the arrangement in which the first aperture H1 of the first shutter 111 is located in front of the target T2, the problem of contamination described with reference to FIG. 21 can occur. More specifically, the material emitted from the target T3 passes through the second aperture H2, moves between the first shutter 111 and the second shutter 112, and reaches the target T2 through the first aperture H1. This can cause the problem of contamination on the target T2.

In the first embodiment, however, the central angle $\alpha H12$ of an arc, on the second virtual circle VC2, whose two ends respectively correspond to the centers of the first and second apertures H1 and H2 of the first shutter 111 is equal to the central angle of an arc whose two ends respectively correspond to the centers of the first and second target holders 91 and 92, of the plurality of target holders 91, 92, and 93, the interval between which is the largest on the first virtual circle VC1. When, therefore, sputtering is to be performed by using only the target T3, the first aperture H1 of the first shutter 111 is arranged at a position shifted from the front surface of the target T2 (a position shifted in a direction to separate from the target T3) to reduce contamination on the target T2. In this case, the first aperture H1 of the first shutter 111 is located at a position shifted from each of the front surfaces of the targets T1, T2, and T3.

Figure 4A:
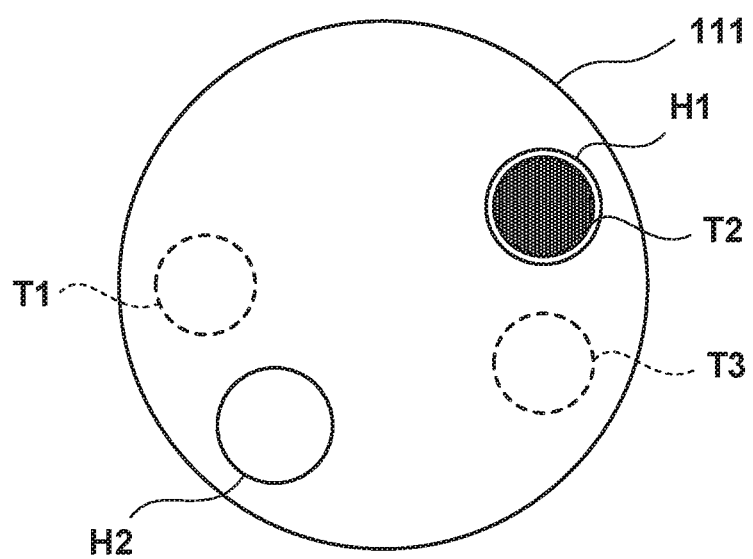
FIG. 4A is a view exemplarily showing control on the positional relationship between the targets and the apertures of the first and second shutters.
Figure 4B:
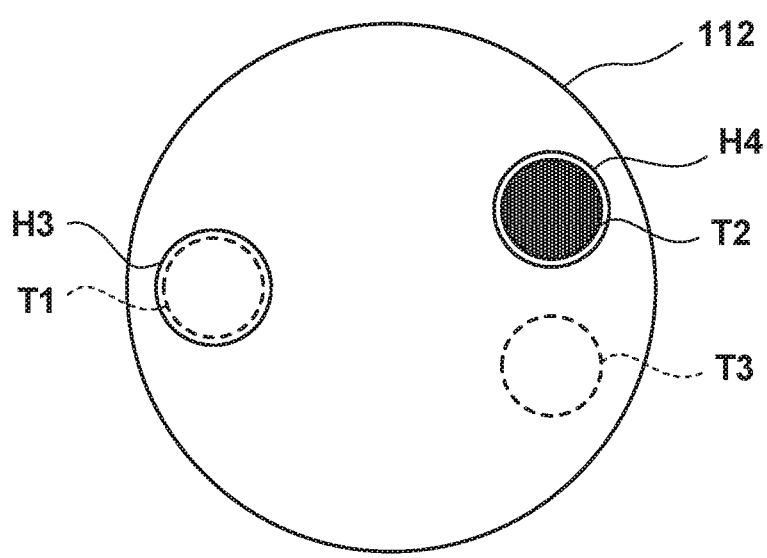
FIG. 4B is a view exemplarily showing control on the positional relationship between the targets and the apertures of the first and second shutters.

FIGS. 4A, 4B, and 6B each exemplarily show a state in which one target T2 of the targets T1, T2, and T3 is used for sputtering. When sputtering is to be performed by using only the target T2, the first aperture H1 of the first shutter 111 is arranged in front of the target T2, and the second aperture H2 is arranged at a position shifted from the front surface of the target T1 (a position shifted in a direction to separate from the target T2). This reduces contamination on the target T1.

Figure 5A:
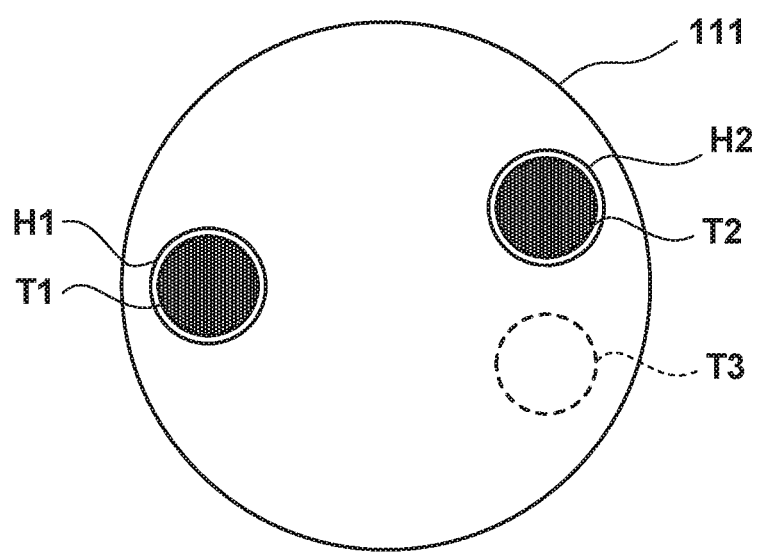
FIG. 5A is a view exemplarily showing control on the positional relationship between the targets and the apertures of the first and second shutters.
Figure 5B:
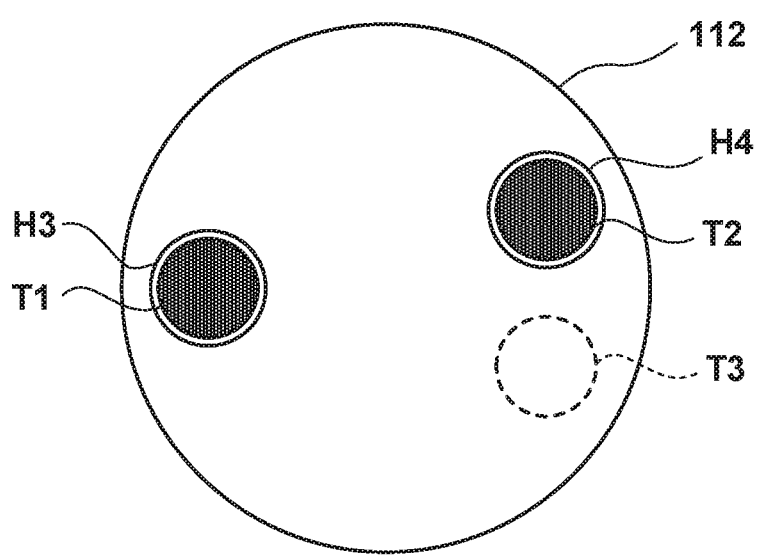
FIG. 5B is a view exemplarily showing control on the positional relationship between the targets and the apertures of the first and second shutters.
Figure 6A:
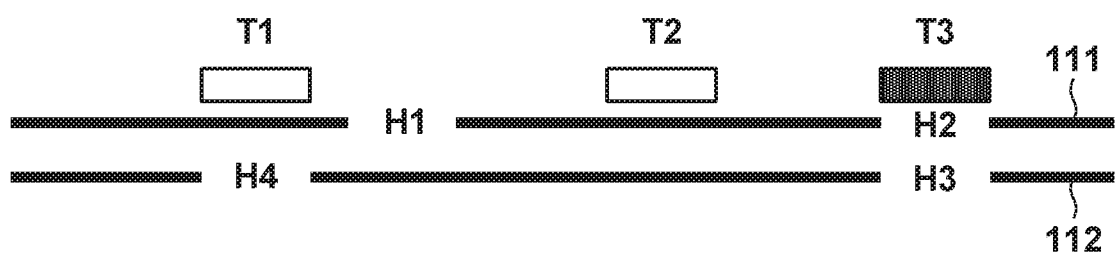
FIG. 6A is a view exemplarily showing control on the positional relationship between the targets and the apertures of the first and second shutters.
Figure 6B:
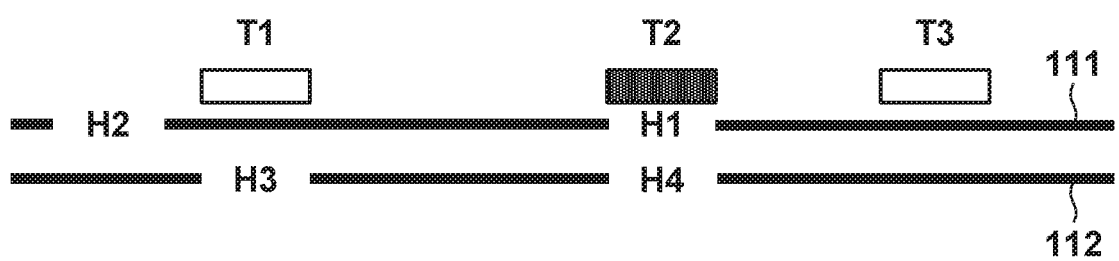
FIG. 6B is a view exemplarily showing control on the positional relationship between the targets and the apertures of the first and second shutters.
Figure 6C:
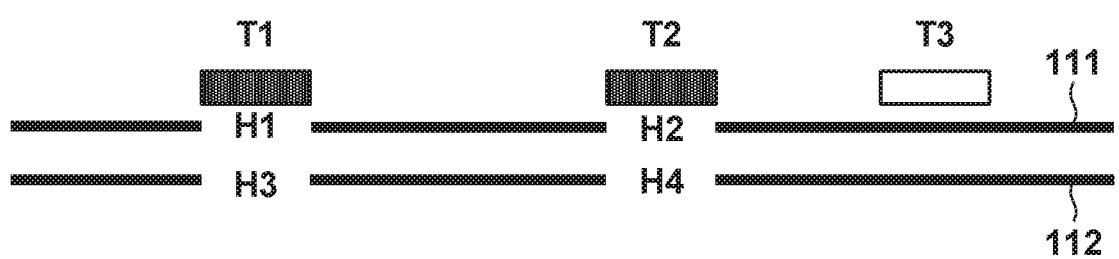
FIG. 6C is a view exemplarily showing control on the positional relationship between the targets and the apertures of the first and second shutters.

FIGS. 5A, 5B, and 6C each exemplarily show a state in which the targets T1 and T2 of the targets T1, T2, T3, and T4 are simultaneously used for sputtering (that is, co-sputtering is performed).

Figure 19:
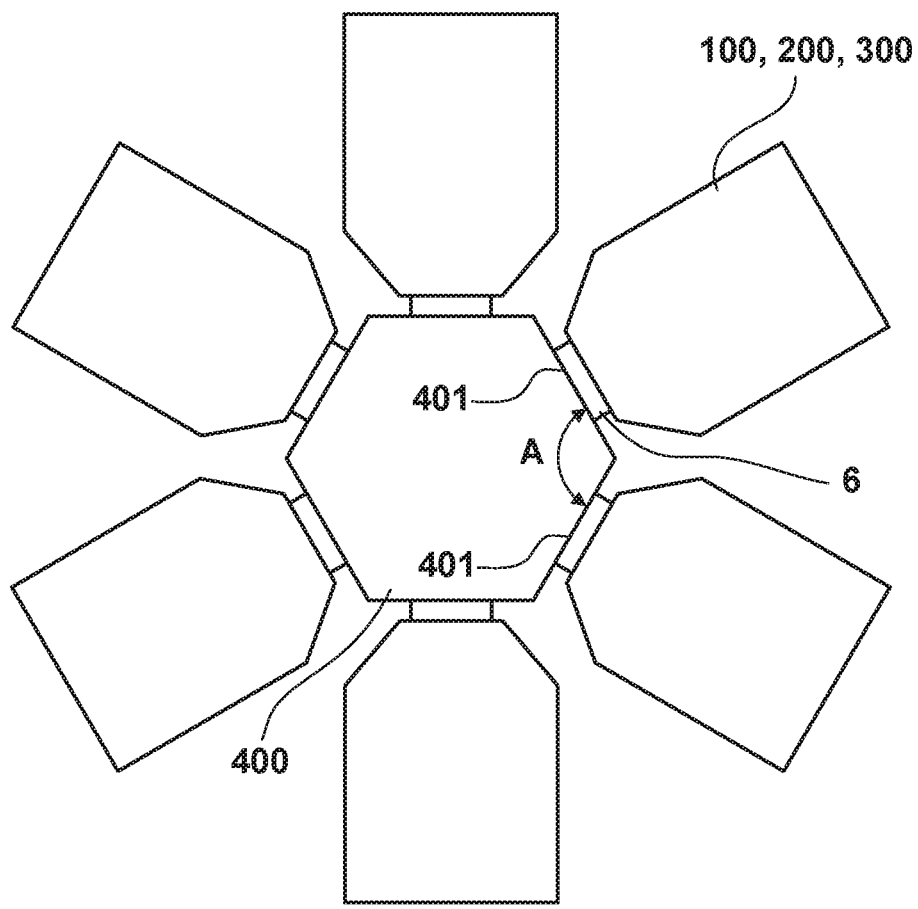
FIG. 19 is a sectional view of a substrate processing apparatus according to one embodiment of the present invention.
Figure 20:
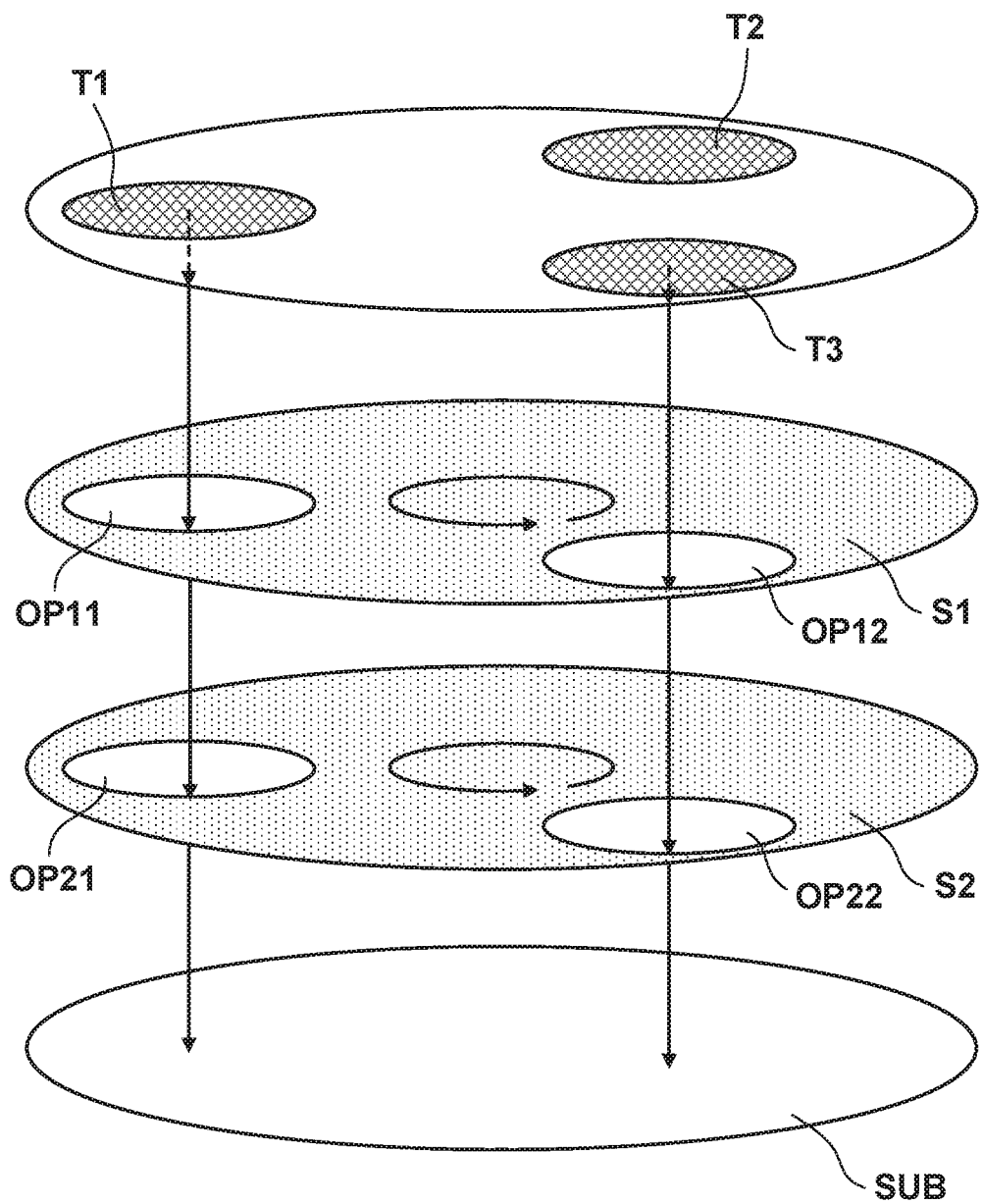
FIG. 20 is a view exemplarily showing a sputtering apparatus including a plurality of targets arranged at equal intervals and a double rotary shutter mechanism which selects a target to be used for sputtering from the plurality of targets.

FIG. 19 exemplarily shows a substrate processing apparatus including one or a plurality of sputtering apparatuses 100 arranged around the conveyance chamber 400. The conveyance chamber 400 has a plurality of connection surfaces 401. The sputtering apparatus 100 is connected to at least one of the plurality of connection surfaces 401. The conveyance chamber 400 and the sputtering apparatus 100 are connected to each other through the gate valve 6. An angle A defined by the adjacent connection surfaces 401 of the plurality of connection surfaces 401 is preferably larger than 90°. This makes it possible to arrange more sputtering apparatuses 100 around the conveyance chamber 400.

Figure 7A:
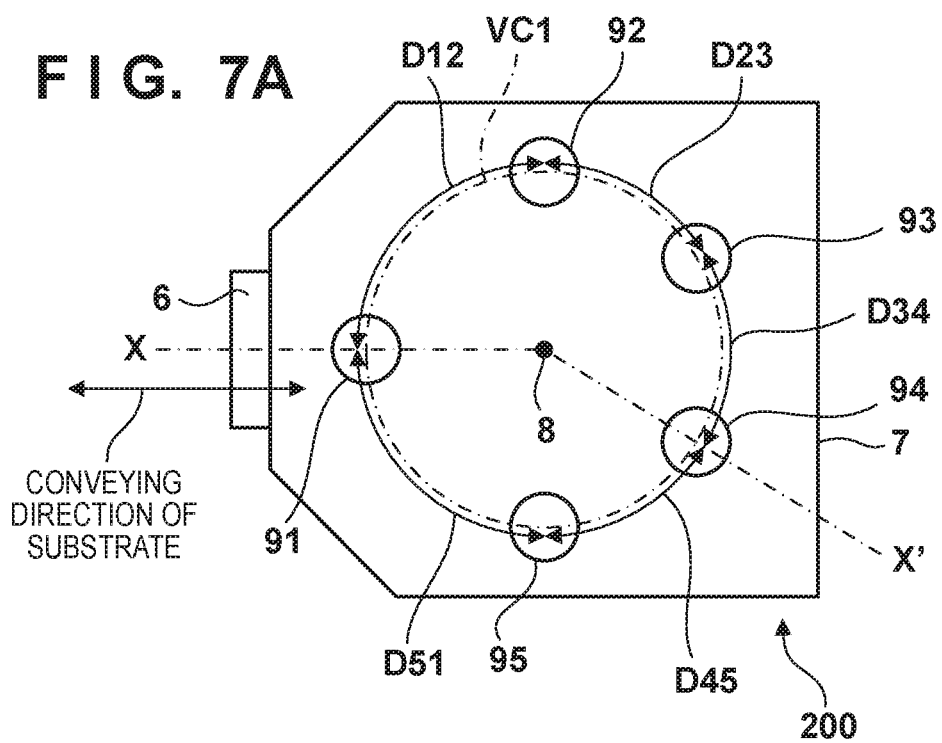
FIG. 7A is a schematic plan view showing a sputtering apparatus according to the second embodiment of the present invention.
Figure 7B:
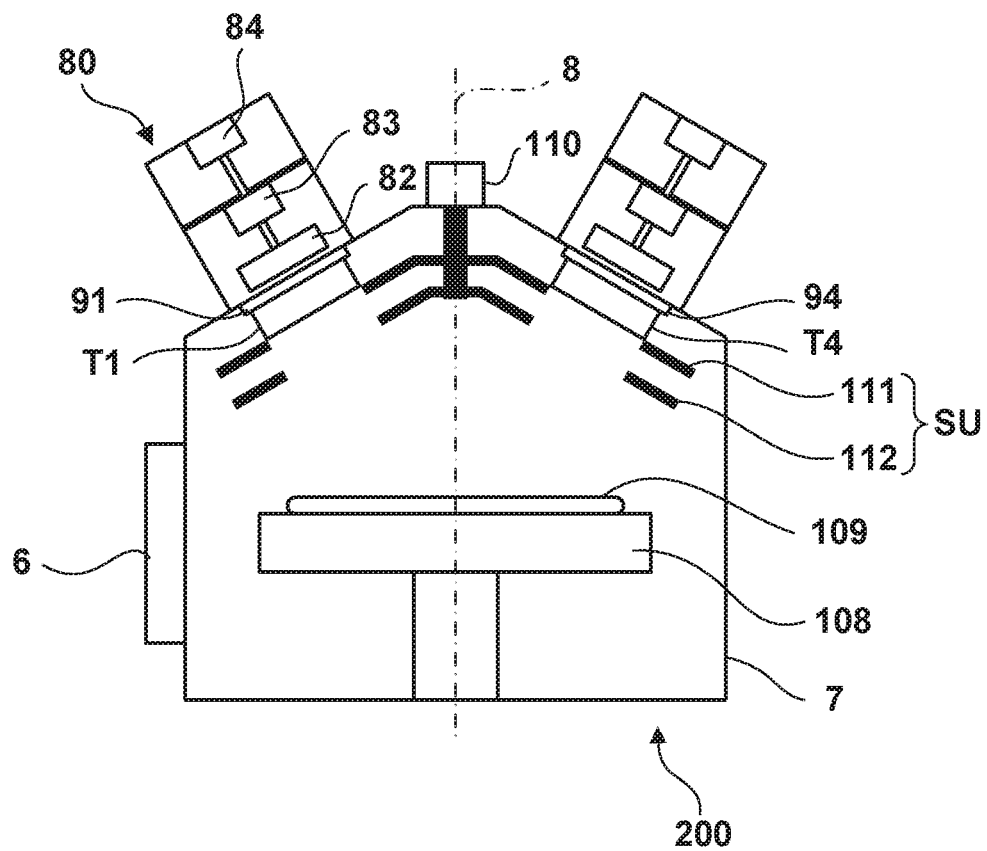
FIG. 7B is a schematic sectional view showing the sputtering apparatus according to the second embodiment of the present invention.

The second embodiment of the present invention will be described below. Note that details which are not mentioned in the second embodiment can comply with the first embodiment unless they contradict. FIG. 7A is a schematic plan view of a sputtering apparatus 200 according to the second embodiment of the present invention. FIG. 7B is a schematic sectional view of the sputtering apparatus 200 taken along a line X-X' in FIG. 7A. The sputtering apparatus 200 includes a chamber 7, a substrate holder 108, and first to fifth target holders 91, 92, 93, 94, and 95 as a plurality of target holders.

The substrate holder 108 can hold a substrate 109 in the chamber 7 and rotate about the axis 8 perpendicular to the surface of the substrate 109. The first to fifth target holders 91, 92, 93, 94, and 95 respectively hold targets T1, T2, T3, T4, and T5. The first to fifth target holders 91, 92, 93, 94, and 95 as a plurality of target holders are arranged along a first virtual circle VC1 centered on an axis 8 clockwise in the order of the first target holder 91, the second target holder 92, the third target holder 93, the fourth target holder 94, and the fifth target holder 95.

There are at least two types of arrangement intervals between the first to fifth target holders 91, 92, 93, 94, and 95 on the first virtual circle VC1. In this case, the arrangement interval between the first target holder 91 and the second target holder 92 on the first virtual circle VC1 is represented by D12, the arrangement interval between the second target holder 92 and the third target holder 93 on the first virtual circle VC1 is represented by D23, the arrangement interval between the third target holder 93 and the fourth target holder 94 on the first virtual circle VC1 is represented by D34, the arrangement interval between the fourth target holder 94 and the fifth target holder 95 on the first virtual circle VC1 is represented by D45, and the arrangement interval between the fifth target holder 95 and the first target holder 91 on the first virtual circle VC1 is represented by D51.

In the case shown in FIG. 7A, D12=D51>D23=D34=D45, and there are two types of arrangement intervals between the first to fifth target holders 91, 92, 93, 94, and 95 on the first virtual circle VC1. If all the intervals D12, D23, D34, D45, and D51 are different from each other, there are five types of arrangement intervals between the first to fifth target holders 91, 92, 93, 94, and 95 on the first virtual circle VC1.

The sputtering apparatus 200 is provided with a gate valve 6, and the substrate 109 is conveyed between the internal space and the external space of the chamber 7 through the gate valve 6.

The sputtering apparatus 200 also includes a shutter unit SU for selecting a target to be used for sputtering from the targets T1, T2, T3, T4, and T5 respectively held by the first to fifth target holders 91, 92, 93, 94, and 95. The shutter unit SU can include first and second shutters 111 and 112 which can rotate about the axis 8 and a driving unit 110 which individually rotates the first and second shutters 111 and 112. The first shutter 111 and the second shutter 112 each have two apertures, and can perform sputtering by simultaneously using two targets (co-sputtering).

Figure 8A:
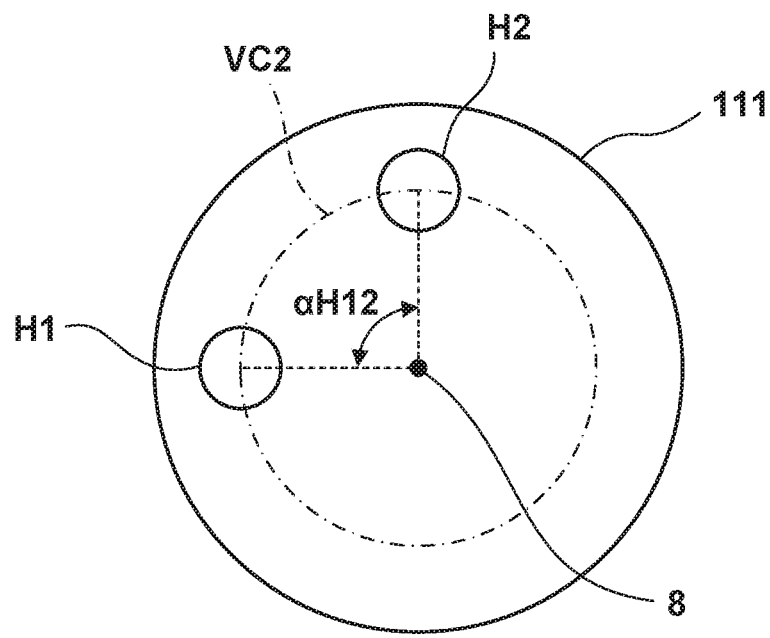
FIG. 8A is a view showing an example of the arrangement of a first shutter.
Figure 8B:
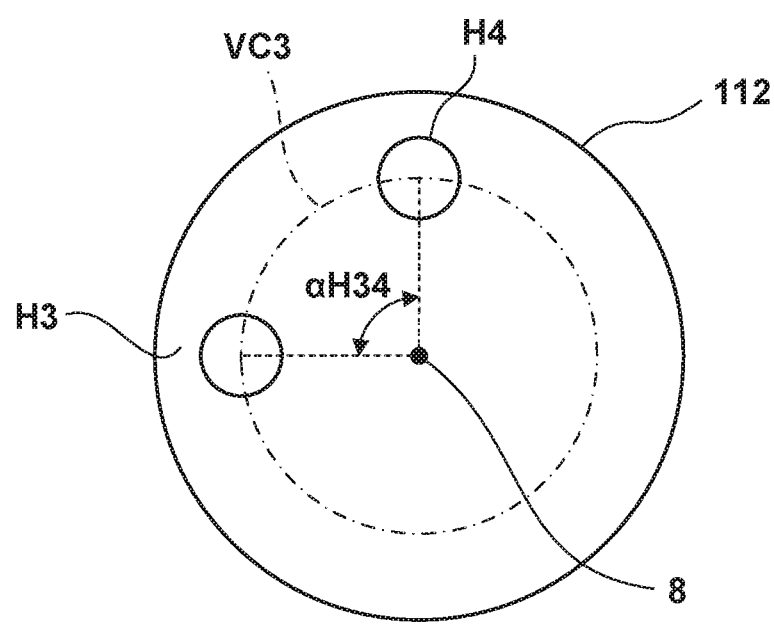
FIG. 8B is a view showing an example of the arrangement of a second shutter.

As exemplarily shown in FIG. 8A, the first shutter 111 has first and second apertures H1 and H2 whose centers are arranged on a second virtual circle VC2 centered on the axis 8. As exemplarily shown in FIG. 8B, the second shutter 112 has third and fourth apertures H3 and H4 whose centers are arranged on a third virtual circle VC3 centered on the axis 8. The driving unit 110 drives the first shutter 111 and the second shutter 112 such that one of the targets T1, T2, T3, T4, and T5 which is used for sputtering is exposed to the substrate 109 through an aperture of the first shutter 111 and an aperture of the second shutter 112. The first shutter 111 and the second shutter 112 are arranged so as to be spaced apart from each other in a direction along the axis 8. The first shutter 111 is arranged between the target holders 91, 92, 93, 94, and 95 and the second shutter 112.

A central angle $\alpha H12$ of an arc, on the second virtual circle VC2, whose two ends respectively correspond to the centers of the first and second apertures H1 and H2 of the first shutter 111 is equal to a central angle $\alpha H34$ of an arc, on the third virtual circle VC3, whose two ends respectively correspond to the centers of the third and fourth apertures H3 and H4 of the second shutter 112, and is equal to the central angle of an arc whose two ends respectively correspond to the centers of the first and second target holders 91 and 92, of the plurality of target holders 91, 92, 93, 94, and 95, the interval between which is the largest on the first virtual circle VC1. Note that if D12=D51>D23=D34=D45, the fifth target holder 95 and the first target holder 91, besides the first target holder 91 and the second target holder 92, are two targets, of the plurality of target holders 91, 92, 93, 94, and 95, the interval between which is the largest on the first virtual circle VC1.

Control on the positional relationship between the targets T1, T2, T3, T4, and T5, the apertures H1 and H2 of the first shutter 111, and the apertures H3 and H4 of the second shutter 112 will be exemplarily described below with reference to FIGS. 9A to 12C. FIGS. 12A to 12C are sectional views of the targets T1, T2, T3, T4, and T5, the apertures H1 and H2 of the first shutter 111, and the apertures H3 and H4 of the second shutter 112 along the first virtual circle VC1. The controller shown in FIG. 22 can control the positional relationship exemplarily shown in FIGS. 9A to 12C.

Referring to FIGS. 9A to 12C, each target indicated by the hatching is the one that is used for sputtering, and each target indicated by the outline solid line or outline dotted line is the one that is not used for sputtering. In addition, each target indicated by the outline solid line is the one that is located at the same position as that of an aperture of the first shutter 111 or an aperture of the second shutter 112. Each target indicated by the outline dotted line is the one that is located at a position different from either that of each aperture of the first shutter 111 or that of each aperture of each second shutter 112.

Figure 9A:
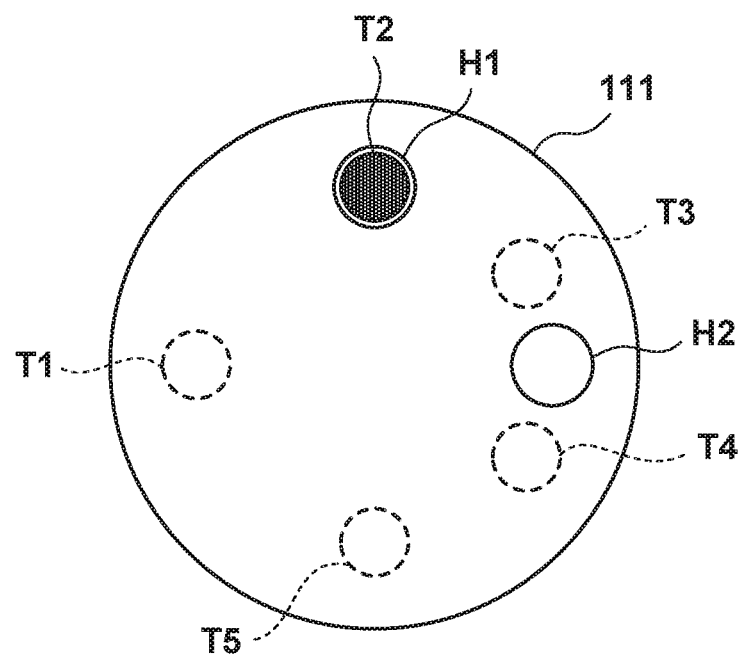
FIG. 9A is a view exemplarily showing control on the positional relationship between targets and the apertures of the first and second shutters.
Figure 9B:
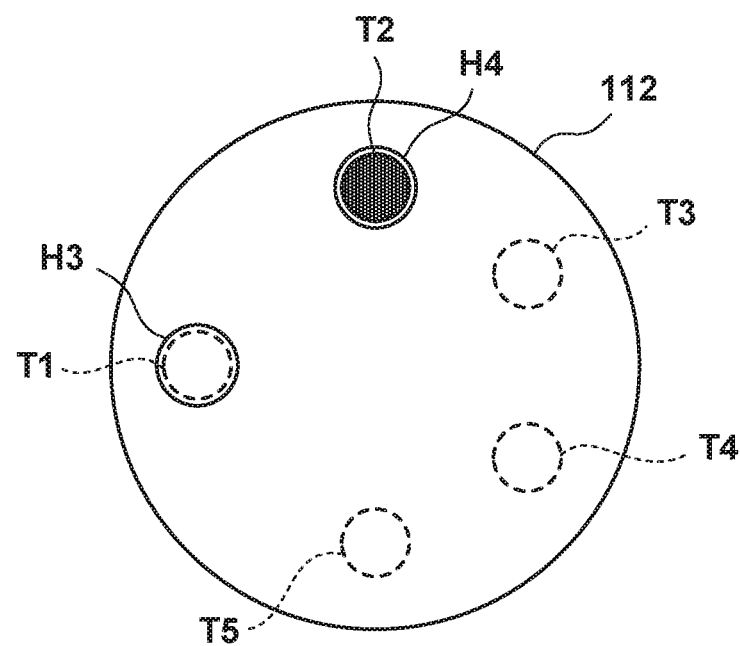
FIG. 9B is a view exemplarily showing control on the positional relationship between the targets and the apertures of the first and second shutters.

FIGS. 9A, 9B, and 12A each exemplarily show a state in which one target T2 of the targets T1, T2, T3, T4, and T5 is used for sputtering. In the arrangement in which the second aperture H2 of the first shutter 111 is located in front of the target T3, the problem of contamination described with reference to FIG. 21 can occur. More specifically, the material emitted from the target T2 passes through the first aperture H1, moves between the first shutter 111 and the second shutter 112, and reaches the target T3 through the second aperture H2. This can cause the problem of contamination on the target T3.

In the second embodiment, however, the central angle αH12 of an arc, on the second virtual circle VC2, whose two ends respectively correspond to the centers of the first and second apertures H1 and H2 of the first shutter 111 is equal to the central angle of an arc whose two ends respectively correspond to the centers of the first and second target holders 91 and 92, of the plurality of target holders 91, 92, 93, 94, and 95, the interval between which is the largest on the first virtual circle VC1. When, therefore, sputtering is to be performed by using only the target T2, the second aperture H2 of the first shutter 111 is arranged at a position shifted from the front surface of the target T3 (a position shifted in a direction to separate from the target T2) to reduce contamination on the target T3. In addition, in this case, the second aperture H2 of the first shutter 111 is located at a position shifted from each of the front surfaces of the targets T1, T2, T3, T4, and T5.

Figure 10A:
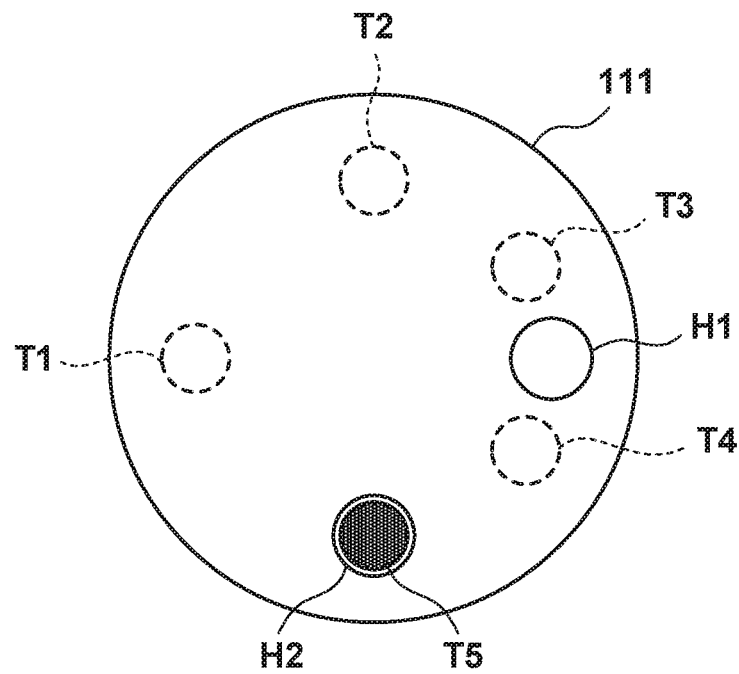
FIG. 10A is a view exemplarily showing control on the positional relationship between the targets and the apertures of the first and second shutters.
Figure 10B:
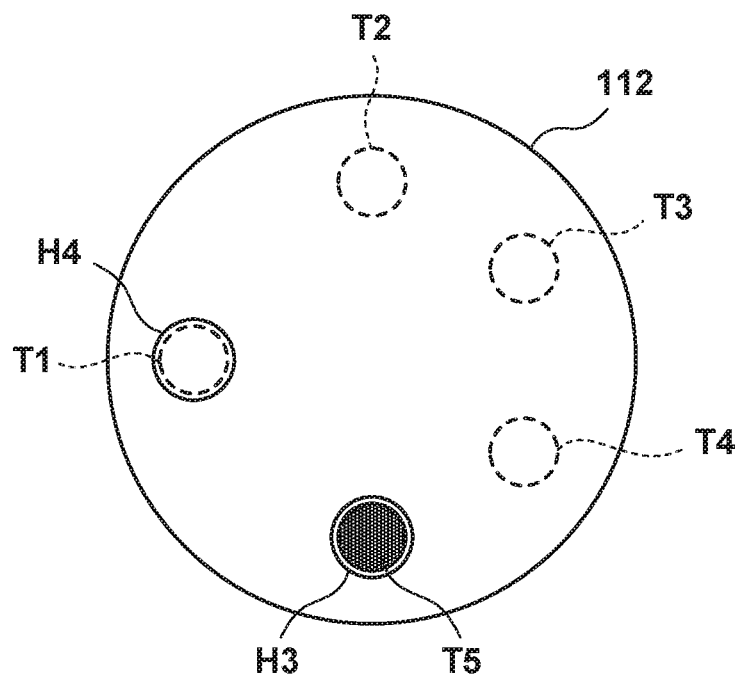
FIG. 10B is a view exemplarily showing control on the positional relationship between the targets and the apertures of the first and second shutters.

FIGS. 10A, 1B, and 12B each exemplarily show a state in which one target T5 of the targets T1, T2, T3, T4, and T5 is used for sputtering. When sputtering is to be performed by using only the target T5, the second aperture H2 of the first shutter 111 is arranged in front of the target T5, and the first aperture H1 is arranged at a position shifted from the front surface of the target T4 (a position shifted in a direction to separate from the target T5). This reduces contamination on the target T4.

On the other hand, although the fourth aperture H4 is located in front of the target T1, the presence of the first shutter 111 reduces the possibility of contamination on the target T1 through the fourth aperture H4. That is, when using the target T5 for sputtering, it is possible to reduce contamination on the targets not used for sputtering by controlling the shutter 111 provided on the target side so as to arrange the first aperture H1, which does not face the target T5, at a position shifted from each of the front surfaces of the remaining targets T1, T2, T3, and T4 and controlling the shutter 112 so as to prevent the first aperture H1 from facing the apertures H3 and H4 of the shutter 112.

Figure 11A:
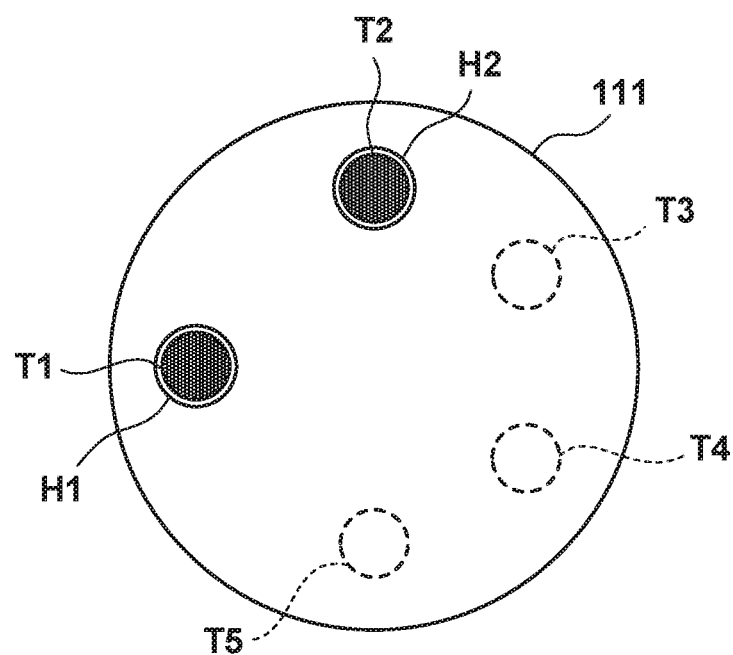
FIG. 11A is a view exemplarily showing control on the positional relationship between the targets and the apertures of the first and second shutters.
Figure 11B:
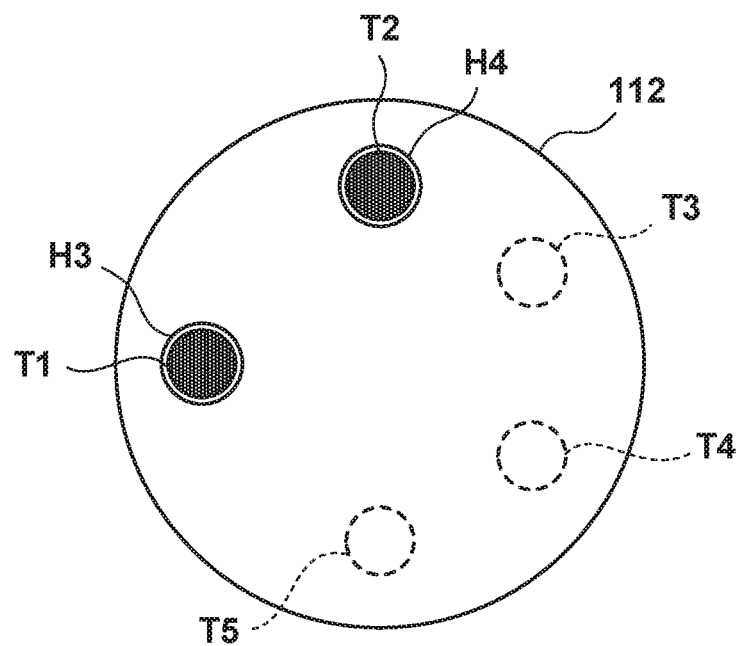
FIG. 11B is a view exemplarily showing control on the positional relationship between the targets and the apertures of the first and second shutters.
Figure 12A:
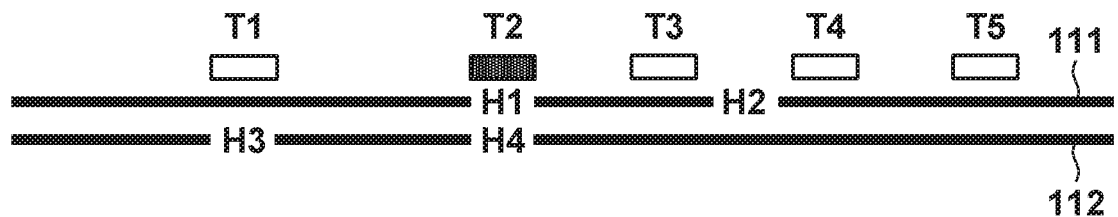
FIG. 12A is a view exemplarily showing control on the positional relationship between the targets and the apertures of the first and second shutters.
Figure 12B:
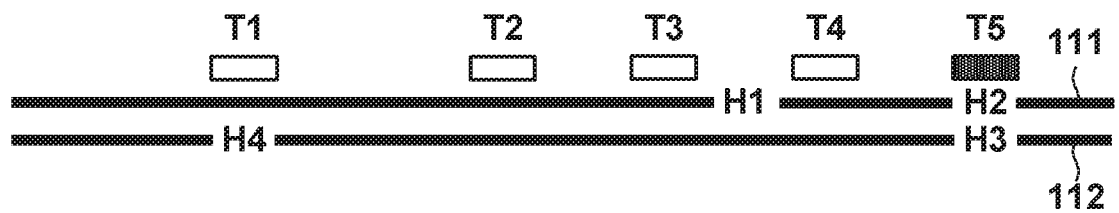
FIG. 12B is a view exemplarily showing control on the positional relationship between the targets and the apertures of the first and second shutters.
Figure 12C:
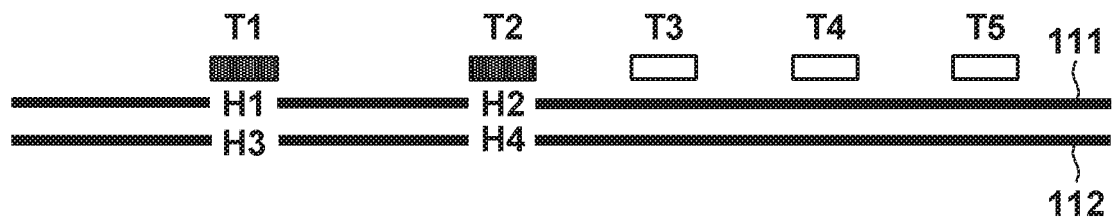
FIG. 12C is a view exemplarily showing control on the positional relationship between the targets and the apertures of the first and second shutters.

FIGS. 11A, 11B, and 12C each exemplarily show a state in which the targets T1 and T2 of the targets T1, T2, T3, T4, and T5 are simultaneously used for sputtering (that is, co-sputtering is performed).

The sputtering apparatus 200 according to the second embodiment can also be applied to the substrate processing apparatus exemplarily shown in FIG. 19.

Figure 13A:
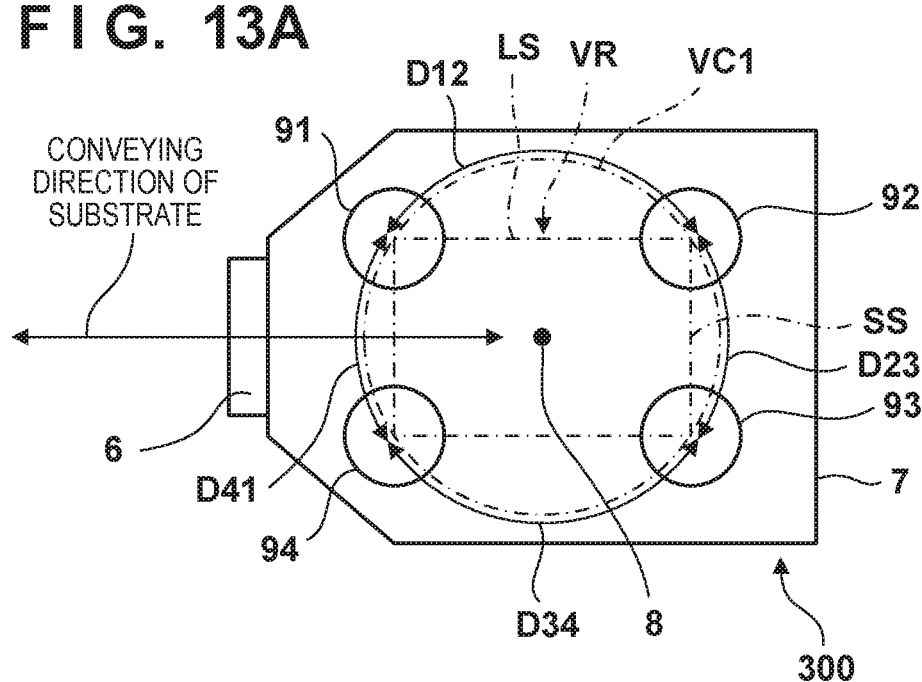
FIG. 13A is a schematic plan view of a sputtering apparatus according to the third embodiment of the present invention.
Figure 13B:
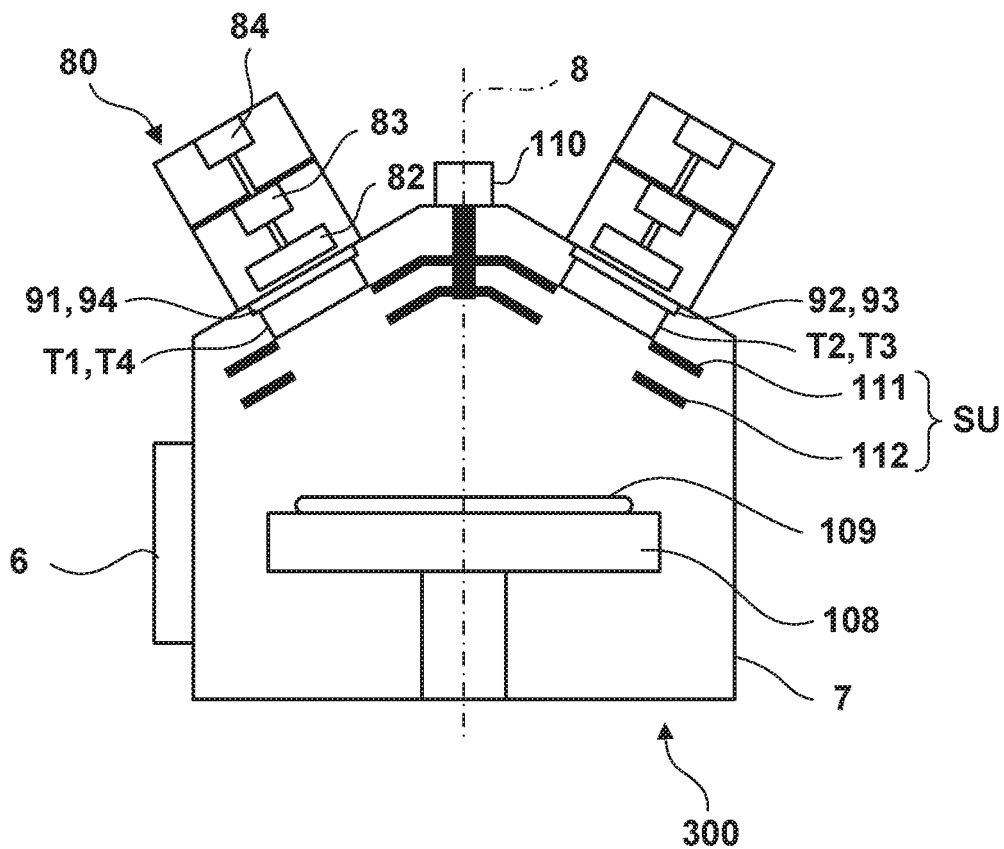
FIG. 13B is a schematic sectional view of the sputtering apparatus according to the third embodiment of the present invention.

The third embodiment of the present invention will be described below. Note that details which are not mentioned in the third embodiment can comply with the first and second embodiments unless they contradict. FIGS. 13A and 13B are a schematic plan view and a schematic sectional view of a sputtering apparatus 300 according to the third embodiment of the present invention. The sputtering apparatus 300 includes a chamber 7, a substrate holder 108, and first to fourth target holders 91, 92, 93, and 94 as a plurality of target holders. The first to third embodiments each have exemplified the case in which the number of target holders is three or more.

The substrate holder 108 can hold a substrate 109 in the chamber 7 and rotate about an axis 8 perpendicular to the surface of the substrate 109. The first to fourth target holders 91, 92, 93, and 94 respectively hold targets T1, T2, T3, and T4. The first to fourth target holders 91, 92, 93, and 94 as a plurality of target holders are arranged along a first virtual circle VC1 centered on the axis 8 clockwise in the order of the first target holder 91, the second target holder 92, the third target holder 93, and the fourth target holder 94.

There are at least two types of arrangement intervals between the first to fourth target holders 91, 92, 93, and 94 on the first virtual circle VC1. In this case, the arrangement interval between the first target holder 91 and the second target holder 92 on the first virtual circle VC1 is represented by D12, the arrangement interval between the second target holder 92 and the third target holder 93 on the first virtual circle VC1 is represented by D23, the arrangement interval between the third target holder 93 and the fourth target holder 94 on the first virtual circle VC1 is represented by D34, and the arrangement interval between the fourth target holder 94 and the first target holder 91 on the first virtual circle VC1 is represented by D41.

In the case shown in FIG. 13A, D12=D34>D23=D41, and there are two types of arrangement intervals between the first to fourth target holders 91, 92, 93, and 94 on the first virtual circle VC1. If all the intervals D12, D23, D34, and D45 are different from each other, there are four types of arrangement intervals between the first to fourth target holders 91, 92, 93, and 94 on the first virtual circle VC1.

The sputtering apparatus 300 is provided with a gate valve 6, and the substrate 109 is conveyed between the internal space and the external space of the chamber 7 through the gate valve 6.

The sputtering apparatus 300 also includes a shutter unit SU for selecting a target to be used for sputtering from the targets T1, T2, T3, and T4 respectively held by the first to fourth target holders 91, 92, 93, and 94. The shutter unit SU can include first and second shutters 111 and 112 which can rotate about the axis 8 and a driving unit 110 which individually rotates the first and second shutters 111 and 112. The first shutter 111 and the second shutter 112 each have two apertures, and can perform sputtering by simultaneously using two targets (co-sputtering).

Figure 14A:
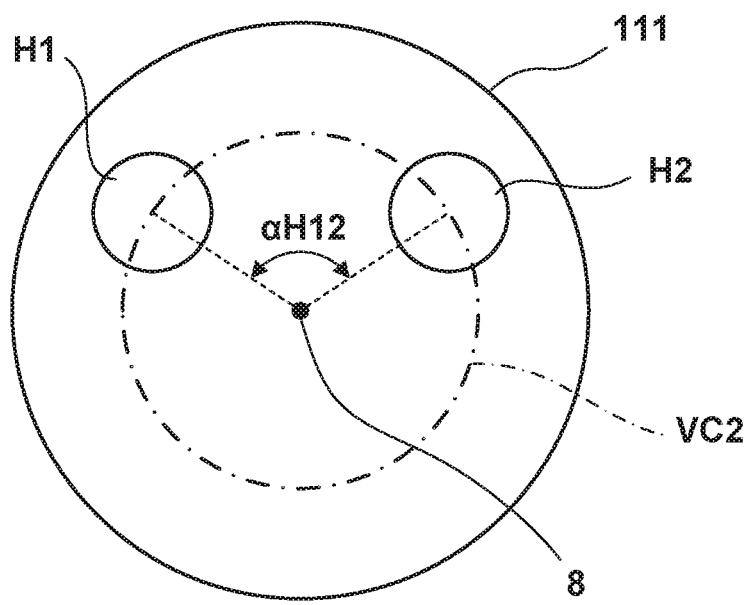
FIG. 14A is a view showing an example of the arrangement of first and second shutters.
Figure 14B:
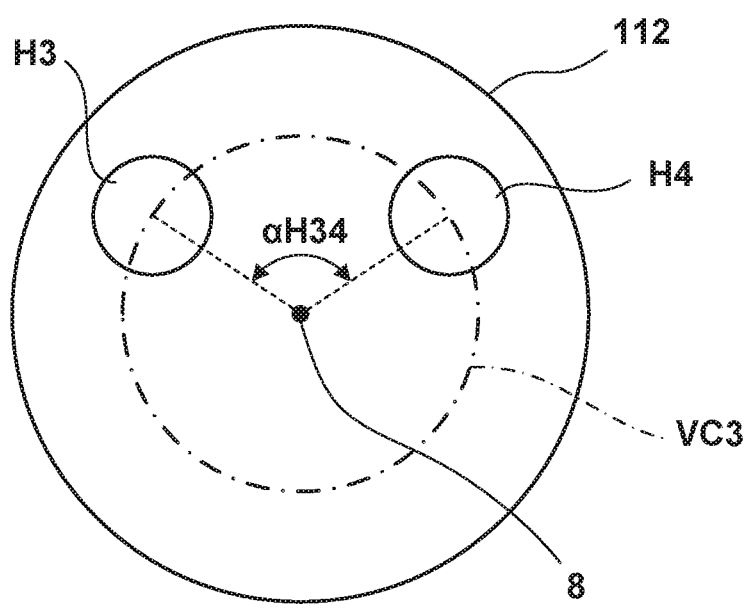
FIG. 14B is a view showing an example of the arrangement of the first and second shutters.

As exemplarily shown in FIG. 14A, the first shutter 111 has first and second apertures H1 and H2 whose centers are arranged on a second virtual circle VC2 centered on the axis 8. As exemplarily shown in FIG. 14B, the second shutter 112 has third and fourth apertures H3 and H4 whose centers are arranged on a third virtual circle VC3 centered on the axis 8. The driving unit 110 drives the first shutter 111 and the second shutter 112 such that one of the targets T1, T2, T3, and T4 which is used for sputtering is exposed to the substrate 109 through an aperture of the first shutter 111 and an aperture of the second shutter 112. The first shutter 111 and the second shutter 112 can be arranged so as to be spaced apart from each other in a direction along the axis 8. The first shutter 111 is arranged between the target holders 91, 92, 93, and 94 and the second shutter 112.

A central angle αH12 of an arc, on the second virtual circle VC2, whose two ends respectively correspond to the centers of the first and second apertures H1 and H2 of the first shutter 111 is equal to a central angle αH34 of an arc, on the third virtual circle VC3, whose two ends respectively correspond to the centers of the third and fourth apertures H3 and H4 of the second shutter 112, and is equal to the central angle of an arc whose two ends respectively correspond to the centers of the first and second target holders 91 and 92, of the plurality of target holders 91, 92, 93, and 94, the interval between which is the largest on the first virtual circle VC1. Note that if D12=D34>D23=D41, the third target holder 93 and the fourth target holder 94, besides the first target holder 91 and the second target holder 92, are two targets, of the plurality of target holders 91, 92, 93, and 94, the interval between which is the largest on the first virtual circle VC1.

Control on the positional relationship between the targets T1, T2, T3, and T4, the apertures H1 and H2 of the first shutter 111, and the apertures H3 and H4 of the second shutter 112 will be exemplarily described below with reference to FIGS. 15A to 18C. FIGS. 18A to 18C are sectional views of the targets T1, T2, T3, and T4, the apertures H1 and H2 of the first shutter 111, and the apertures H3 and H4 of the second shutter 112 along the first virtual circle VC1. The controller shown in FIG. 22 can control the positional relationship exemplarily shown in FIGS. 15A to 18C.

Referring to FIGS. 15A to 18C, each target indicated by the hatching is the one that is used for sputtering, and each target indicated by the outline solid line or outline dotted line is the one that is not used for sputtering. In addition, each target indicated by the outline solid line is the one that is located at the same position as that of an aperture of the first shutter 111 or an aperture of the second shutter 112. Each target indicated by the outline dotted line is the one that is located at a position different from either that of each aperture of the first shutter 111 or that of each aperture of the second shutter 112.

Figure 15A:
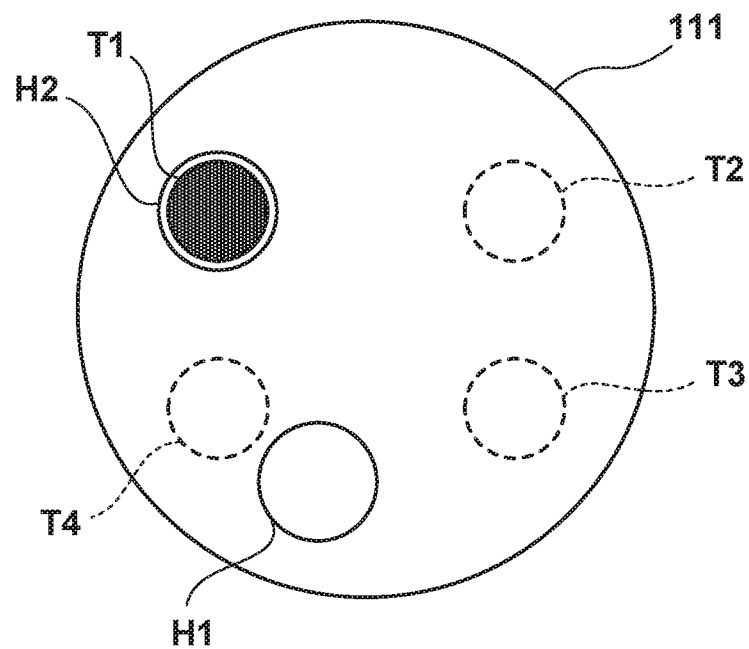
FIG. 15A is a view exemplarily showing control on the positional relationship between targets and the apertures of the first and second shutters.
Figure 15B:
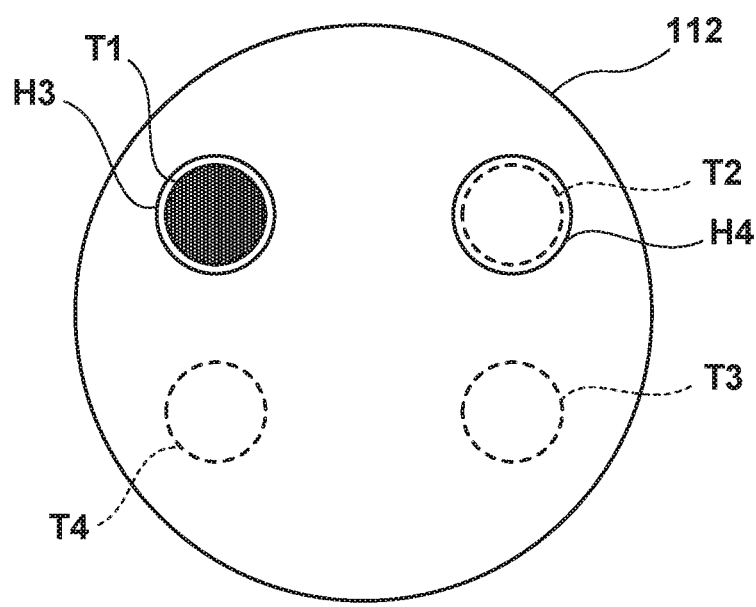
FIG. 15B is a view exemplarily showing control on the positional relationship between the targets and the apertures of the first and second shutters.

FIGS. 15A, 15B, and 18A each exemplarily show a state in which one target T1 of the targets T1, T2, T3, T4, and T5 is used for sputtering. In the arrangement in which the first aperture H1 of the first shutter 111 is located in front of the target T4, the problem of contamination described with reference to FIG. 21 can occur. More specifically, the material emitted from the target T2 passes through the second aperture H2, moves between the first shutter 111 and the second shutter 112, and reaches the target T4 through the first aperture H1. This can cause the problem of contamination on the target T4.

In the third embodiment, however, the central angle αH12 of an arc, on the second virtual circle VC2, whose two ends respectively correspond to the centers of the first and second apertures H1 and H2 of the first shutter 111 is equal to the central angle of an arc whose two ends respectively correspond to the centers of the first and second target holders 91 and 92, of the plurality of target holders 91, 92, 93, and 94, the interval between which is the largest on the first virtual circle VC1. When, therefore, sputtering is to be performed by using only the target T1, the first aperture H1 of the first shutter 111 is arranged at a position shifted from the front surface of the target T4 (a position shifted in a direction to separate from the target T1) to reduce contamination on the target T3. In addition, in this case, the first aperture H1 of the first shutter 111 is located at a position shifted from each of the front surfaces of the targets T1, T2, T3, and T4.

Figure 16A:
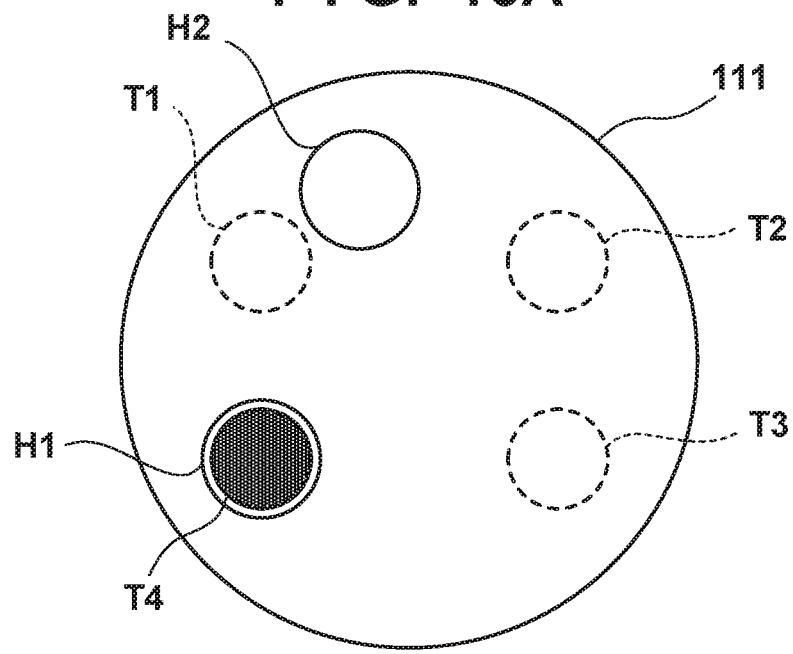
FIG. 16A is a view exemplarily showing control on the positional relationship between the targets and the apertures of the first and second shutters.
Figure 16B:
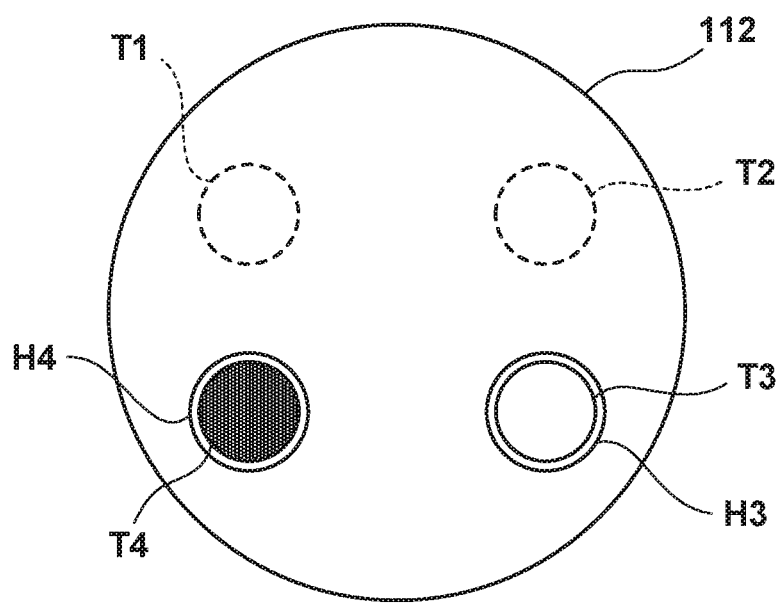
FIG. 16B is a view exemplarily showing control on the positional relationship between the targets and the apertures of the first and second shutters.

FIGS. 16A, 16B, and 18B each exemplarily show a state in which one target T4 of the targets T1, T2, T3, and T4 is used for sputtering. When sputtering is to be performed by using only the target T4, the first aperture H1 of the first shutter 111 is arranged in front of the target T4, and the second aperture H2 is arranged at a position shifted from the front surface of the target T1 (a position shifted in a direction to separate from the target T4). This reduces contamination on the target T1. On the other hand, although the third aperture H3 is located in front of the target T3, the presence of the first shutter 111 reduces the possibility of contamination on the target T3 through the third aperture H3. That is, when using the target T4 for sputtering, it is possible to reduce contamination on the targets not used for sputtering by controlling the shutter 111 provided on the target side so as to arrange the second aperture H2, which does not face the target T4, at a position shifted from each of the front surfaces of the remaining targets T1, T2, and T3 and controlling the shutter 112 so as to prevent the second aperture H2 from facing the apertures H3 and H4 of the shutter 112.

Figure 17A:
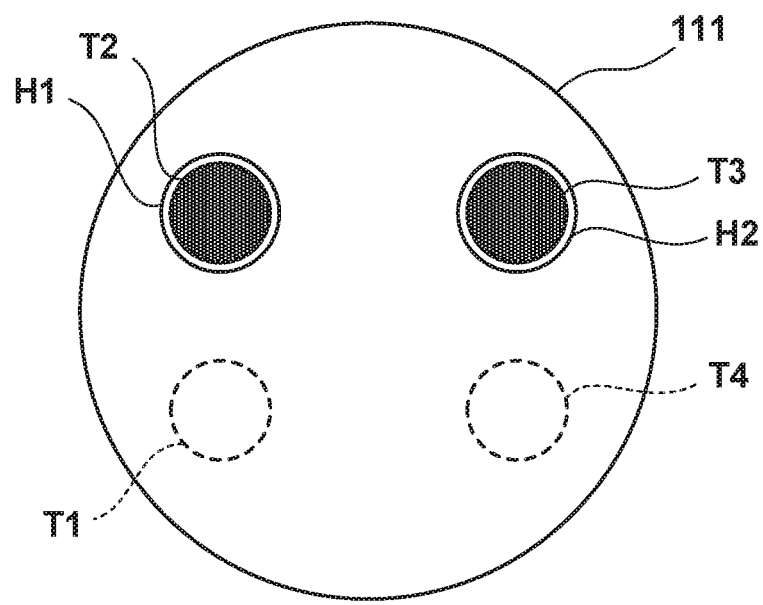
FIG. 17A is a view exemplarily showing control on the positional relationship between the targets and the apertures of the first and second shutters.
Figure 17B:
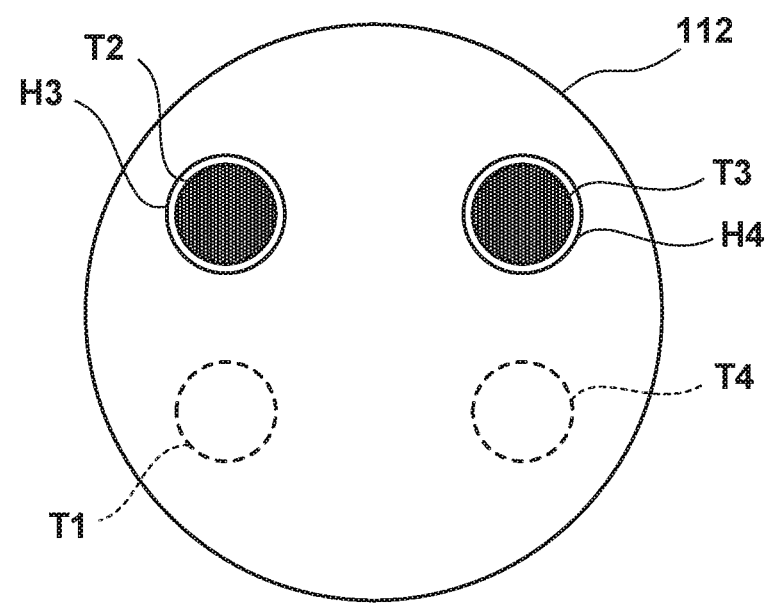
FIG. 17B is a view exemplarily showing control on the positional relationship between the targets and the apertures of the first and second shutters.
Figure 18A:
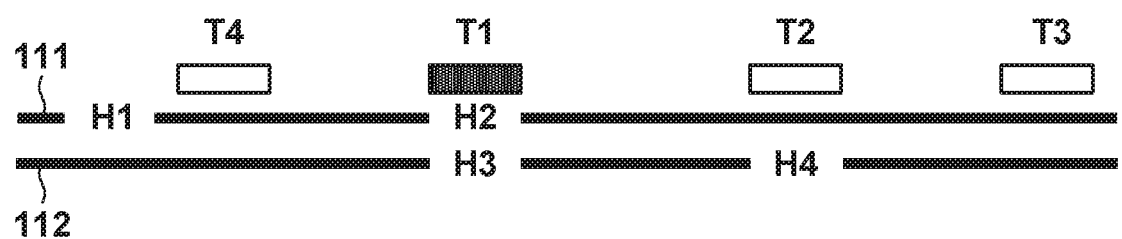
FIG. 18A is a view exemplarily showing control on the positional relationship between the targets and the apertures of the first and second shutters.
Figure 18B:
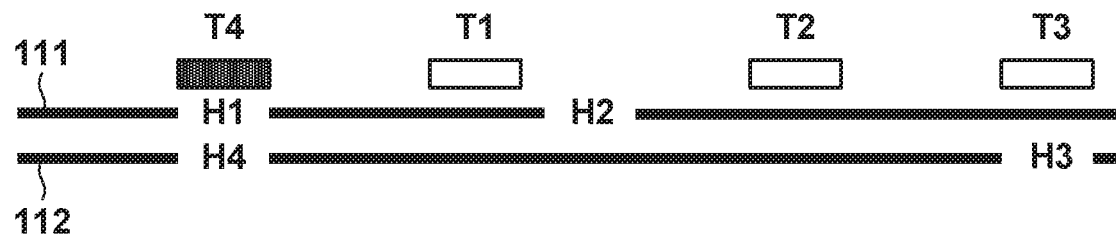
FIG. 18B is a view exemplarily showing control on the positional relationship between the targets and the apertures of the first and second shutters.
Figure 18C:
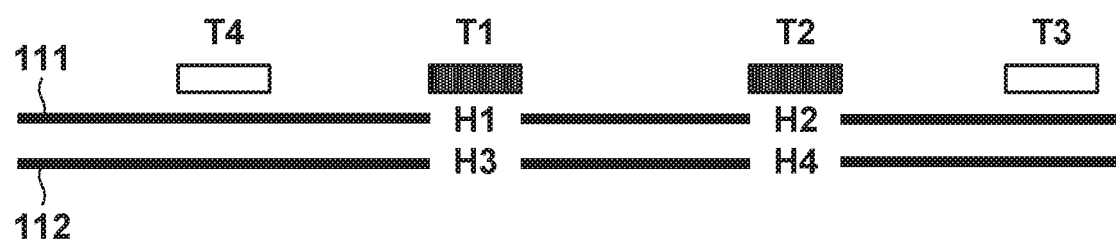
FIG. 18C is a view exemplarily showing control on the positional relationship between the targets and the apertures of the first and second shutters.

FIGS. 17A, 17B, and 18C each exemplarily show a state in which the targets T1 and T2 of the targets T1, T2, T3, and T4 are simultaneously used for sputtering (that is, co-sputtering is performed).

As exemplarily shown in FIG. 19, in order to arrange many sputtering apparatuses 300 around a conveyance chamber 400, it should decrease the size of the sputtering apparatus 300 in the widthwise direction. As described above, when a magnet unit 80 is inclined such that the upper portion of the magnet unit 80 is separated from the axis 8, the occupied area of the sputtering apparatus 100 can be decided by the upper portion of the magnet unit 80. In consideration of this, in order to decrease the size of the sputtering apparatus 100 in the widthwise direction, the target holders 91, 92, 93, and 94 should be arranged upon being compressed in the widthwise direction.

In the third embodiment, therefore, the first to fourth target holders 91, 92, 93, and 94 (their centers) are arranged on one virtual circle VC centered on the axis 8 and also arranged at the vertices of a virtual rectangle VR having long sides LS and short sides SS and inscribed in the virtual circle VC such that the first target holder 91 and the fourth target holder 94 (their centers) are respectively arranged at the two vertices of the virtual rectangle VR which define one short side SS, and the distances from them to the gate valve 6 are shorter than the distances from the second target holder 92 and the third target holder 93 to the gate valve 6. In this case, the distances from the first target holder 91 and the fourth target holder 94 to the gate valve 6 are preferably equal to each other.

According to the above arrangement, the target holders 91, 92, 93, and 94 are arranged upon being compressed in the widthwise direction, thereby decreasing the size of the sputtering apparatus 100 in the widthwise direction. This makes it possible to arrange more sputtering apparatuses 100 around the conveyance chamber. In addition, according to the above arrangement, the magnetic fields formed on the surfaces of the targets T1, T2, T3, and T4 which are respectively held by the first to fourth target holders 91, 92, 93, and 94 are equal to each other. For example, the influences which the magnetic field formed on the surface of the target T1 held by the target holder 91 receives from the magnets 82 arranged on the reverse surface sides of the target T2, T3, and T4 held by the target holders 92, 93, and 94 are equivalent to those which the magnetic field formed on the surface of the target T2 held by the target holder 92 receives from the magnets 82 arranged on the reverse surface sides of the target T1, T3, and T4 held by the target holders 91, 93, and 94. That is, arranging the first to fourth target holders 91, 92, 93, and 94 (their centers) at the vertices of the virtual rectangle VR can unify the magnetic fields formed on the surfaces of the targets T1, T3, and T4. This can reduce sputtering characteristic differences which can be caused depending on the positions of the targets in use.

The sputtering apparatus 300 according to the third embodiment can also be applied to the substrate processing apparatus exemplarily shown in FIG. 19.

Figure 22:
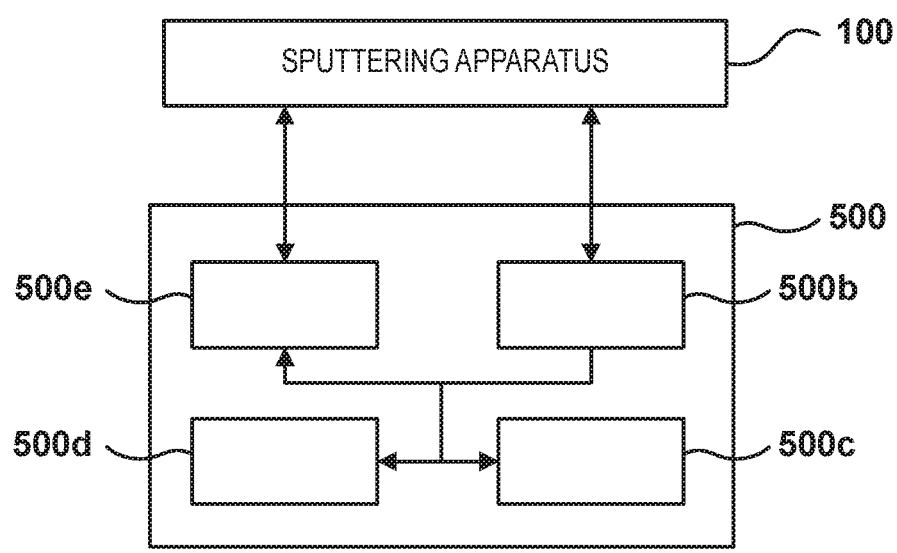
FIG. 22 is a block diagram for explaining a controller provided in a substrate processing apparatus according to one embodiment of the present invention.

The arrangement of a controller 500 which can be applied to the sputtering apparatuses 100, 200, and 300 according to the first to third embodiments will be described with reference to FIG. 22. The controller 500 includes an input unit 500*b*, a storage unit 500*c* storing programs and data, a processor 500*d*, and an output unit 500*e*, and can control the sputtering apparatuses 100, 200, and 300. The controller 500 can control the operation of each of the sputtering apparatuses 100, 200, and 300 by causing the processor 500*d* to read out and execute control programs stored in the storage unit 500*c*. That is, the driving unit 110 can be operated to operate the first shutter 111 and the second shutter 112 under the control of the controller 500. Note that the controller 500 may be provided separately from each of the sputtering apparatuses 100, 200, and 300 or incorporated in each of the sputtering apparatuses 100, 200, and 300. In addition, the controller 400 is connected to a power supply which controls power to be applied to the respective targets (that is, power to be applied to the respective target holders) provided in the sputtering apparatuses 100, 200, and 300 and can control the driving unit 110 in accordance with the supply of power to each target.

The invention claimed is:

1. A sputtering apparatus which includes a chamber, a substrate holder configured to hold a substrate in the chamber and rotate about an axis perpendicular to a surface on which the substrate is held, and a plurality of target holders configured to respectively hold targets, the apparatus comprising:

a shutter unit configured to select one or more targets to be used for sputtering from a plurality of targets respectively held by the plurality of target holders, wherein the shutter unit includes a first shutter and a second shutter configured to rotate about the axis and spaced apart from each other in a direction along the axis, and the first shutter is arranged between the plurality of target holders and the second shutter, a number of the plurality of target holders is an even number, the plurality of target holders are arranged on a first virtual circle centered on the axis, with arrangement intervals measured along the first virtual circle between respective pairs of the target holders, each of the respective pairs formed by two directly adjacent neighboring target holders of the plurality of target holders on the first virtual circle, at least one of the arrangement intervals being a different length than another of the arrangement intervals, the first shutter has a first aperture and a second aperture, with centers of the first aperture and the second aperture being arranged on a second virtual circle centered on the axis, and the second shutter has a third aperture and a fourth aperture, with centers of the third aperture and the fourth aperture being arranged on a third virtual circle centered on the axis, a central angle of an arc, on the second virtual circle, whose two ends respectively correspond to the centers of the first aperture and the second aperture is equal to a central angle of an arc, on the third virtual circle, whose two ends respectively correspond to the centers of the third aperture and the fourth aperture, and is equal to a central angle of an arc whose two ends respectively correspond to centers of a first target holder of the plurality of target holders and a second target holder of the plurality of target holders, wherein the first target holder and the second target holder are a pair of target holders that are directly adjacent each other on the first virtual circle, of the plurality of target holders, an arrangement interval on the first virtual circle, between which the first target holder and the second target holder is the largest among the arrangement intervals on the first virtual circle, between all of respective pairs each formed by two of the plurality of target holders that are directly adjacent each other on the first virtual circle, the sputtering apparatus further comprising a controller that is configured so that when sputtering is to be performed by using only one target of the plurality of targets held by the plurality of target holders:

the first shutter is controlled such that one of the first aperture and the second aperture is arranged in front of the one target, and the other of the first aperture and the second aperture is arranged at a position shifted from in front of the plurality of targets, and the second shutter is controlled such that one of the third aperture and the fourth aperture is arranged in front of the one target, and the other of the third aperture and the further aperture is arranged in front of another target of the plurality of targets, via a portion of the first shutter where the first aperture and the second aperture are not arranged.

2. The sputtering apparatus according to claim 1, wherein the number of the plurality of target holders is four.

3. The sputtering apparatus according to claim 2, wherein the plurality of target holders consist of the first target holder, the second target holder, a third target holder and a fourth target holder,
- the first to fourth target holders are arranged, in a plan view, on vertices of a virtual rectangle having long sides and short sides and inscribed in the first virtual circle centered on the axis such that the first to fourth target holders and the first to fourth targets are arranged within the chamber in the plan view,
- the first target holder and the second target holder are respectively arranged on two vertices defining one long side of the virtual rectangle,
- the third target holder and the fourth target holder are respectively arranged on two vertices defining the other long side of the virtual rectangle
- the substrate is conveyed between an internal space of the chamber and an external space of the chamber through a gate valve provided to the chamber, and
- a distance from the first target holder and the fourth target holder to the gate valve is shorter than distances from the second target holder and the third target holder to the gate valve.

4. The sputtering apparatus according to claim 1, wherein each of the plurality of targets has a circular shape, and each of the first to fourth apertures has a circular shape.

5. A sputtering apparatus which includes a chamber, a substrate holder configured to hold a substrate in the chamber and rotate about an axis perpendicular to a surface on which the substrate is held, and a plurality of target holders configured to respectively hold targets, the apparatus comprising:
- a shutter unit configured to select one or more targets to be used for sputtering from a plurality of targets respectively held by the plurality of target holders,
- wherein the shutter unit includes a first shutter and a second shutter configured to rotate about the axis and spaced apart from each other in a direction along the axis, and the first shutter is arranged between the plurality of target holders and the second shutter,
- the plurality of target holders are arranged on a first virtual circle centered on the axis, with arrangement intervals measured along the first virtual circle between respective pairs of the target holders, each of the respective pairs formed by two directly adjacent neighboring target holders of the plurality of target holders on the first virtual circle, at least one of the arrangement intervals being a different length than another of the arrangement intervals,
- the first shutter has a first aperture and a second aperture, with centers of the first aperture and the second aperture being arranged on a second virtual circle centered on the axis, and the second shutter has a third aperture and a fourth aperture, with centers of the third aperture and the fourth aperture being arranged on a third virtual circle centered on the axis,
- a central angle of an arc, on the second virtual circle, whose two ends respectively correspond to the centers of the first aperture and the second aperture is equal to a central angle of an arc, on the third virtual circle, whose two ends respectively correspond to the centers of the third aperture and the fourth aperture, and is equal to a central angle of an arc whose two ends respectively correspond to centers of a first target holder of the plurality of target holders and a second target holder of the plurality of target holders, wherein the first target holder and the second target holder are a pair of target holders that are directly adjacent each other on the first virtual circle,
- of the plurality of target holders, an arrangement interval on the first virtual circle, between which the first target holder and the second target holder is the largest among the arrangement intervals on the first virtual circle, between all of respective pairs each formed by two of the plurality of target holders that are directly adjacent each other on the first virtual circle,
- the sputtering apparatus further comprising a controller that is configured so that when sputtering is to be performed by using only one target of the plurality of targets held by the plurality of target holders:
- the first shutter is controlled such that one of the first aperture and the second aperture is arranged in front of the one target, and the other of the first aperture and the second aperture is arranged at a position shifted from in front of the plurality of targets, and
- the second shutter is controlled such that one of the third aperture and the fourth aperture is arranged in front of the one target, and the other of the third aperture and the further aperture is arranged in front of another target of the plurality of targets, via a portion of the first shutter where the first aperture and the second aperture are not arranged.

* * * * *